United States Patent
Shealy

(10) Patent No.: US 11,398,402 B2
(45) Date of Patent: Jul. 26, 2022

(54) WAFER SCALE PACKAGING

(71) Applicant: Akoustis, Inc., Huntersville, NC (US)

(72) Inventor: Jeffrey B. Shealy, Cornelius, NC (US)

(73) Assignee: Akoustis, Inc., Huntersville, NC (US)

( * ) Notice: Subject to any disclaimer, the term of this patent is extended or adjusted under 35 U.S.C. 154(b) by 0 days.

(21) Appl. No.: 16/547,456

(22) Filed: Aug. 21, 2019

(65) Prior Publication Data
US 2019/0385893 A1    Dec. 19, 2019

Related U.S. Application Data

(60) Continuation of application No. 15/717,803, filed on Sep. 27, 2017, now Pat. No. 10,431,490, which is a
(Continued)

(51) Int. Cl.
*H03H 3/02* (2006.01)
*H01L 21/76* (2006.01)
(Continued)

(52) U.S. Cl.
CPC .......... *H01L 21/7605* (2013.01); *H03H 3/02* (2013.01); *H03H 9/02031* (2013.01); *H03H 9/02157* (2013.01); *H03H 9/0523* (2013.01); *H03H 9/0552* (2013.01); *H03H 9/174* (2013.01); *H01L 2224/16225* (2013.01); *H03H 9/0509* (2013.01); *H03H 9/0514* (2013.01); *H03H 2003/023* (2013.01)

(58) Field of Classification Search
CPC ............. H03H 9/0509; H03H 9/02157; H03H 9/0552; H03H 9/0514
See application file for complete search history.

(56) References Cited

U.S. PATENT DOCUMENTS

| 5,231,327 A | 7/1993 | Ketcham |
| 5,894,647 A | 4/1999 | Lakin |

(Continued)

FOREIGN PATENT DOCUMENTS

| JP | 2009100197 A | 5/2009 |
| WO | 2016122877 A1 | 8/2016 |

OTHER PUBLICATIONS

International Search Report for PCT/US2018/050521 dated Jan. 28, 2019.
(Continued)

*Primary Examiner* — Sarah K Salerno
(74) *Attorney, Agent, or Firm* — Richard T Ogawa; Ogawa P.C.

(57) ABSTRACT

A method of wafer scale packaging acoustic resonator devices and an apparatus therefor. The method including providing a partially completed semiconductor substrate comprising a plurality of single crystal acoustic resonator devices, each having a first electrode member, a second electrode member, and an overlying passivation material. At least one of the devices to be configured with an external connection, a repassivation material overlying the passivation material, an under metal material overlying the repassivation material. Copper pillar interconnect structures are then configured overlying the electrode members, and solder bump structures are form overlying the copper pillar interconnect structures.

10 Claims, 38 Drawing Sheets

Related U.S. Application Data division of application No. 14/341,314, filed on Jul. 25, 2014, now Pat. No. 9,805,966.

(51) Int. Cl.
*H03H 9/02* (2006.01)
*H03H 9/05* (2006.01)
*H03H 9/17* (2006.01)

(56) References Cited

U.S. PATENT DOCUMENTS

| | | | |
|---|---|---|---|
| 6,051,907 A | 4/2000 | Ylilammi | |
| 6,114,635 A | 9/2000 | Lakin et al. | |
| 6,262,637 B1 | 7/2001 | Bradley et al. | |
| 6,377,137 B1 | 4/2002 | Ruby | |
| 6,384,697 B1 | 5/2002 | Ruby | |
| 6,472,954 B1 | 10/2002 | Ruby et al. | |
| 6,617,060 B2 | 9/2003 | Weeks, Jr. et al. | |
| 6,812,619 B1 | 11/2004 | Kaitila et al. | |
| 6,841,922 B2 | 1/2005 | Aigner et al. | |
| 6,864,619 B2 | 3/2005 | Aigner et al. | |
| 6,879,224 B2 | 4/2005 | Frank | |
| 6,909,340 B2 | 6/2005 | Aigner et al. | |
| 6,933,807 B2 | 8/2005 | Marksteiner et al. | |
| 7,112,860 B2 | 9/2006 | Saxler | |
| 7,250,360 B2 | 7/2007 | Shealy et al. | |
| 7,268,436 B2 | 9/2007 | Aigner et al. | |
| 7,365,619 B2 | 4/2008 | Aigner et al. | |
| 7,514,759 B1 | 4/2009 | Mehta et al. | |
| 7,875,910 B2 | 1/2011 | Sheppard et al. | |
| 7,982,363 B2 | 7/2011 | Chitnis | |
| 8,304,271 B2 | 11/2012 | Huang et al. | |
| 2005/0219012 A1 | 10/2005 | Milsom et al. | |
| 2007/0080611 A1 | 4/2007 | Yamada et al. | |
| 2008/0024042 A1 | 1/2008 | Isobe et al. | |
| 2010/0029031 A1* | 2/2010 | Perruchot | H03H 9/2436 438/50 |
| 2011/0114968 A1 | 5/2011 | Sheppard et al. | |
| 2011/0278993 A1* | 11/2011 | Iwamoto | H03H 9/174 310/345 |
| 2012/0287575 A1 | 11/2012 | Sheppard et al. | |
| 2013/0278610 A1* | 10/2013 | Stephanou | H01P 1/208 345/501 |
| 2015/0097638 A1 | 4/2015 | Yu et al. | |
| 2015/0357993 A1 | 12/2015 | Shealy | |
| 2016/0028367 A1 | 1/2016 | Shealy | |
| 2016/0036580 A1 | 2/2016 | Shealy | |
| 2018/0013405 A1 | 1/2018 | Takata | |
| 2018/0054176 A1 | 2/2018 | Kim et al. | |

OTHER PUBLICATIONS

International Search Report and Written Opinion for PCT/US2019/040729, dated Oct. 22, 2019.

International Search Report and Written Opinion for PCT/US2019/048412, dated Nov. 19, 2019.

* cited by examiner

| Filter Solution | Conventional | Present Example |
|---|---|---|
| Filter type | BAW or FBAR | BAW |
| Filter Peizo Material | AlN, ZnO, PZT | Single Crystal GaN or AlGaN |
| Substrate | Silicon/Sapphire | Silicon |
| Technique | Sputtered | MOCVD |
| Crystal Quality | Amorphous (random) | Single-Crystal (ordered) |
| Acoustic Coupling ($K^2$) | Poor (6.5%–15%) | Better (>30% projected) |
| Filter Insertion Loss (dB) | -3dB (Lossy) | -1dB is goal (Disruptive) |
| Adjacent channel rejection | good | better |
| Transmitter Impact | 60% Tx Power lost | 20% Tx Power lost |
| Receiver Impact | Degrade Signal Quality | Improved Signal Quality |

FIG. 13

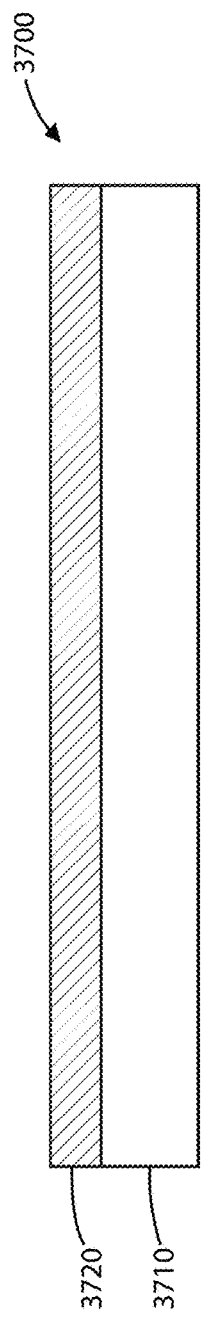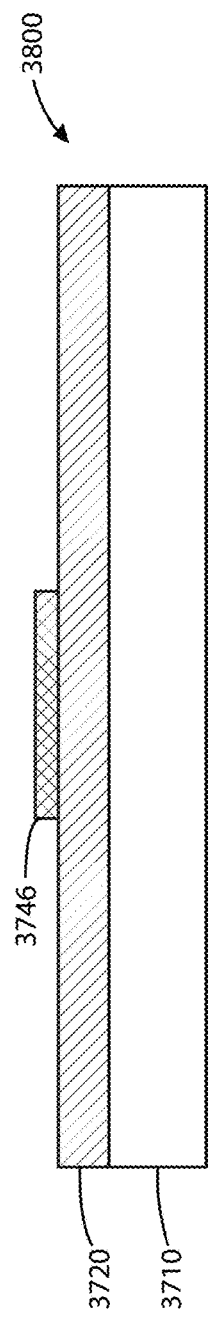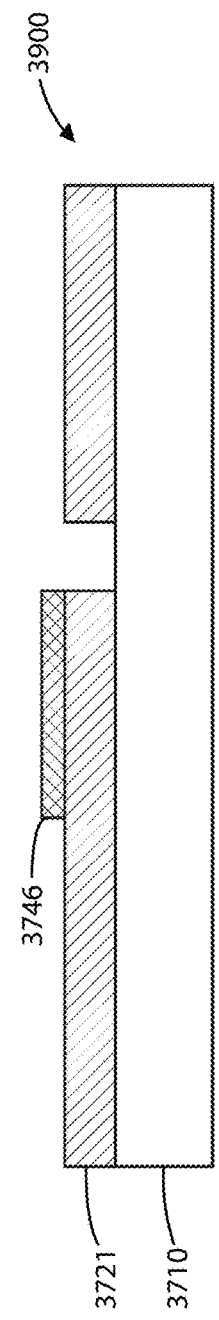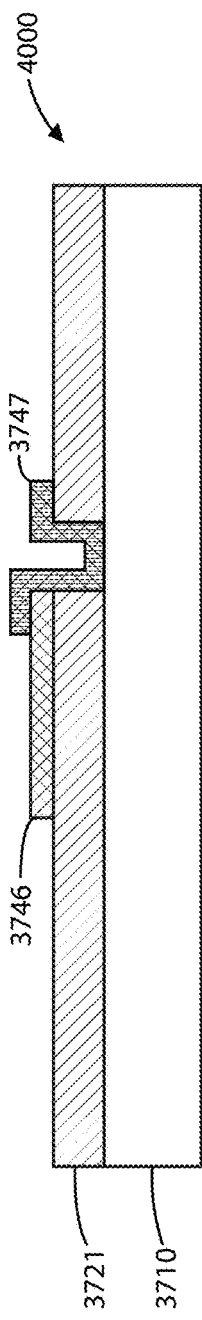

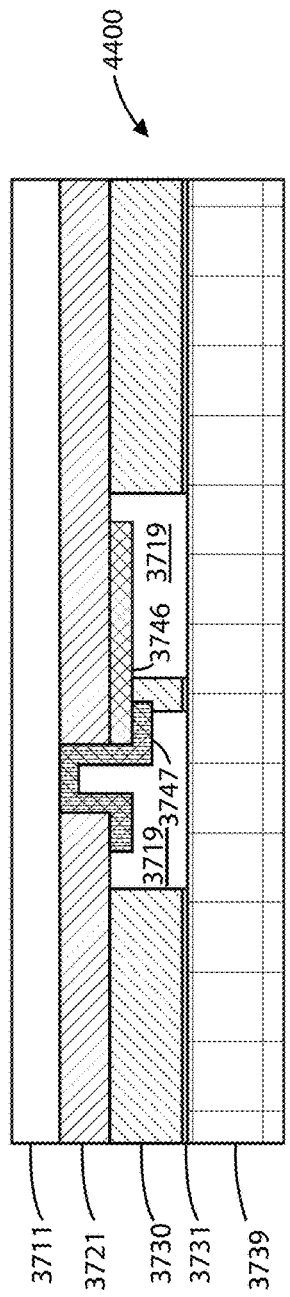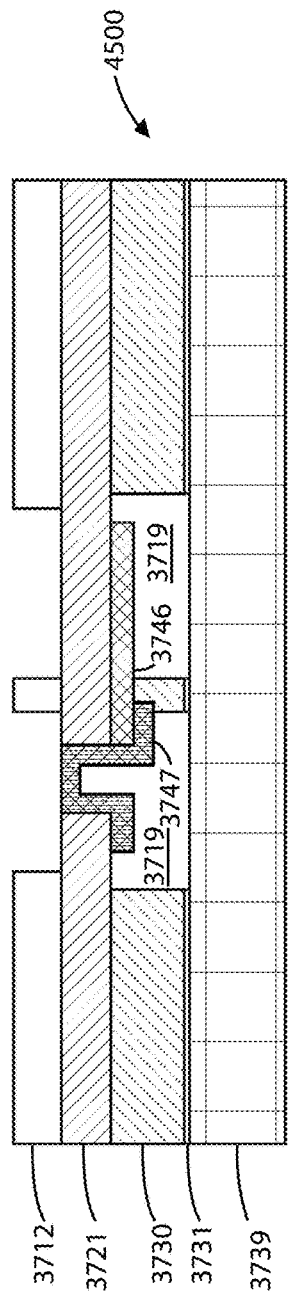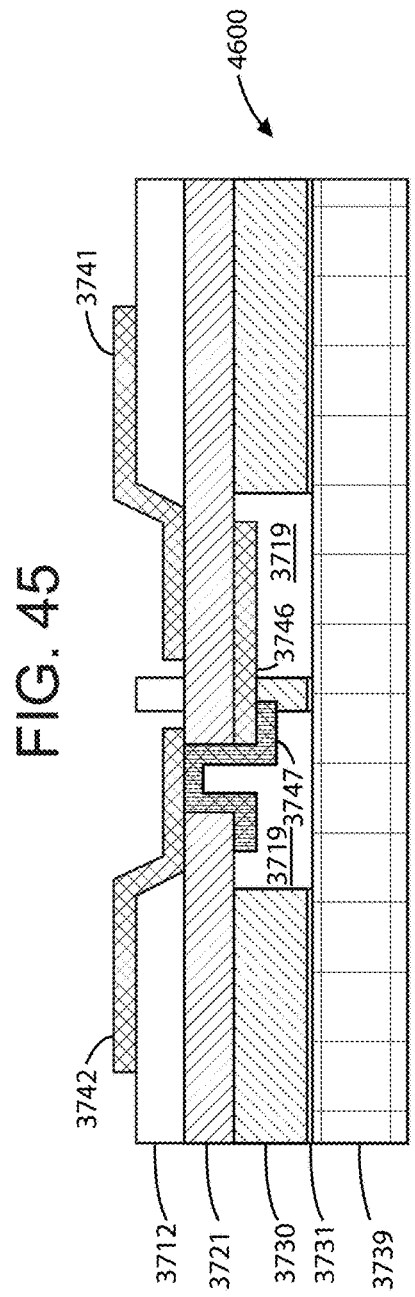

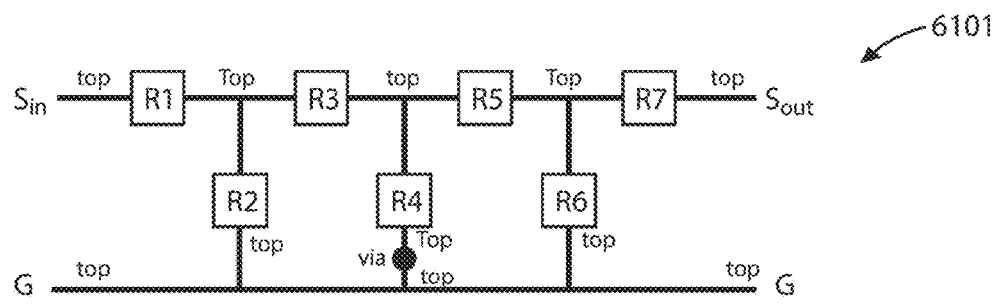
FIG. 61A
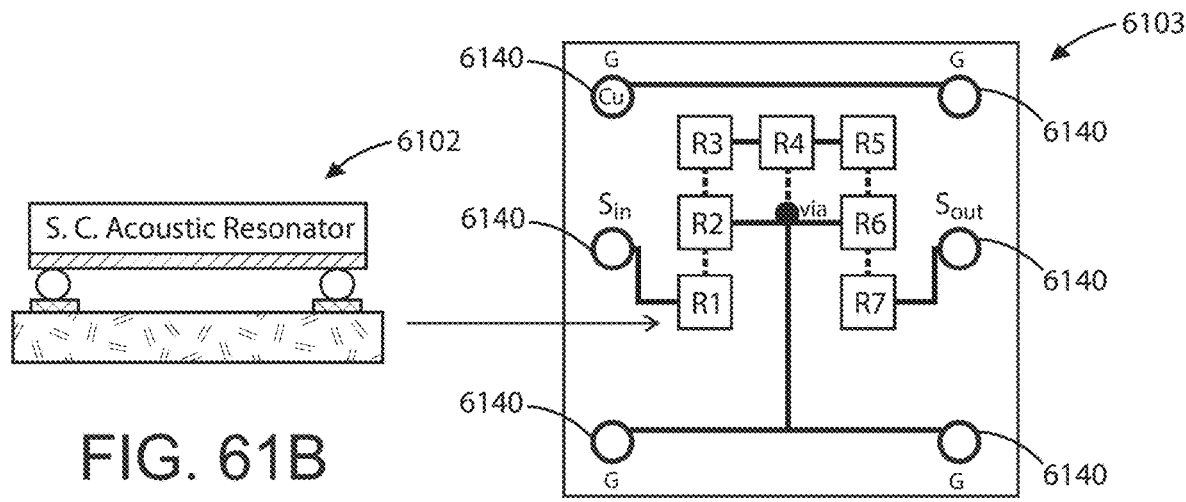
FIG. 61B
FIG. 61C
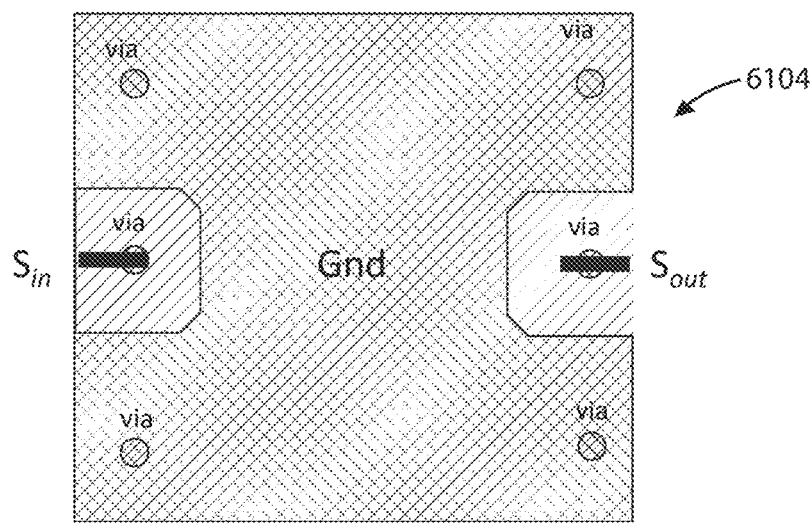
FIG. 61D

WAFER SCALE PACKAGING

CROSS-REFERENCES TO RELATED APPLICATIONS

The present application is a continuation of and claims priority to U.S. application Ser. No. 15/717,803 filed Sep. 27, 2017, which is a divisional of U.S. application Ser. No. 14/341,314 filed Jul. 25, 2014, now issued as U.S. Pat. No. 9,805,966 on Oct. 31, 2017, which incorporates by reference, for all purposes, the following concurrently filed patent applications, all commonly owned: U.S. patent application Ser. No. 14/298,057, filed Jun. 6, 2014, U.S. patent application Ser. No. 14/298,076, filed Jun. 6, 2014, and U.S. patent application Ser. No. 14/298,100, filed Jun. 6, 2014.

BACKGROUND OF THE INVENTION

The present invention relates generally to electronic devices. More particularly, the present invention provides techniques related to a wafer scale packaging for a resonator device. Merely by way of example, the invention has been applied to a resonator device for a communication device, mobile device, computing device, among others.

Mobile telecommunication devices have been successfully deployed world-wide. Over a billion mobile devices, including cell phones and smartphones, were manufactured in a single year and unit volume continues to increase year-over-year. With ramp of 4G/LTE in about 2012, and explosion of mobile data traffic, data rich content is driving the growth of the smartphone segment—which is expected to reach 2B per annum within the next few years. Coexistence of new and legacy standards and thirst for higher data rate requirements is driving RF complexity in smartphones. Unfortunately, limitations exist with conventional RF technology that is problematic, and may lead to drawbacks in the future.

From the above, it is seen that techniques for improving electronic devices are highly desirable.

BRIEF SUMMARY OF THE INVENTION

According to the present invention, techniques generally related to electronic devices are provided. More particularly, the present invention provides techniques related to a wafer scale packaging for a resonator device. Merely by way of example, the invention has been applied to a resonator device for a communication device, mobile device, computing device, among others.

In an example, the present invention provides a method of configuring a single crystal acoustic resonator, SCAR, resonator or filter circuit and mounting the device into a wafer level package. In an example, the present method and resulting device are configured to connect the circuit to external applications. Additionally, the present method and resulting device is also singulated in an example. Of course, there can be other variations, modifications, and alternatives.

In an example, the present techniques provide for Wafer Scale Packaging (WSP) of:
a) single crystal (S.C.) acoustic resonator
b) S.C. BAW filter integrate circuit
c) S.C. BAW filter discrete circuit using one or more S.C. acoustic resonators In an embodiment, the present wafer scale packaging apparatus can include a partially completed semiconductor substrate, the semiconductor substrate comprising a plurality of single crystal acoustic resonator devices, each of the devices having a first electrode member, a second electrode member, and an overlying passivation material; for at least one of the devices to be configured with an external connection, a repassivation material overlying the passivation material, the repassivation material having a first region exposing the first electrode member and a second region exposing the second electrode member; an under metal material overlying the repassivation material and covering the first region and the second region such that the first electrode member and the second electrode member are each in electrical and physical contact with the under metal material; a copper pillar interconnect structure configured to fill the first region and the second region using a deposition process to form a first copper pillar structure overlying the first electrode member and a second copper pillar structure overlying the second electrode member; and a first solder bump structure overlying the first copper pillar structure and a second solder bump structure overlying the second copper pillar structure for the single crystal acoustic resonator device to be configured with the external connection.

One or more benefits are achieved over pre-existing techniques using the invention. In particular, the invention enables a cost-effective resonator device for communications applications. In a specific embodiment, the present device can be manufactured in a relatively simple and cost effective manner. Depending upon the embodiment, the present apparatus and method can be manufactured using conventional materials and/or methods according to one of ordinary skill in the art. The present device uses a gallium and nitrogen containing material that is single crystalline. Depending upon the embodiment, one or more of these benefits may be achieved. Of course, there can be other variations, modifications, and alternatives.

A further understanding of the nature and advantages of the invention may be realized by reference to the latter portions of the specification and attached drawings.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which:

FIG. 13 is a simplified table illustrating features of a conventional filter compared against the present examples according to examples of the present invention.

FIGS. 37 to 54 illustrate a method of manufacturing a resonator device on a transparent substrate according to an embodiment of the present invention.

FIGS. 56A to 61D illustrate examples of resonator devices according to various embodiments of the present invention.

DETAILED DESCRIPTION OF THE INVENTION

According to the present invention, techniques generally related to electronic devices are provided. More particularly, the present invention provides techniques related to a single crystal acoustic resonator. Merely by way of example, the invention has been applied to a resonator device for a communication device, mobile device, computing device, among others.

As additional background, the number of bands supported by smartphones is estimated to grow by 7-fold compared to conventional techniques. As a result, more bands mean high selectivity filter performance is becoming a differentiator in the RF front end of smartphones. Unfortunately, conventional techniques have severe limitations.

That is, conventional filter technology is based upon amorphous materials and whose electromechanical coupling efficiency is poor (only 7.5% for non-lead containing materials) leading to nearly half the transmit power dissipated in high selectivity filters. In addition, single crystal acoustic wave devices are expected to deliver improvements in adjacent channel rejection. Since there are twenty (20) or more filters in present smartphone and the filters are inserted between the power amplifier and the antenna solution, then there is an opportunity to improve the RF front end by reducing thermal dissipation, size of power amplifier while enhancing the signal quality of the smartphone receiver and maximize the spectral efficiency within the system.

Utilizing single crystal acoustic wave device (herein after "SAW" device) and filter solutions, one or more of the following benefits may be achieved: (1) large diameter silicon wafers (up to 200 mm) are expected to realize cost-effective high performance solutions, (2) electromechanical coupling efficiency is expected to more than triple with newly engineered strained piezo electric materials, (3) Filter insertion loss is expected to reduce by 1 dB enabling longer battery life, improve thermal management with smaller RF footprint and improving the signal quality and user experience. These and other benefits can be realized by the present device and method as further provided throughout the present specification, and more particularly below.

Figure 1:
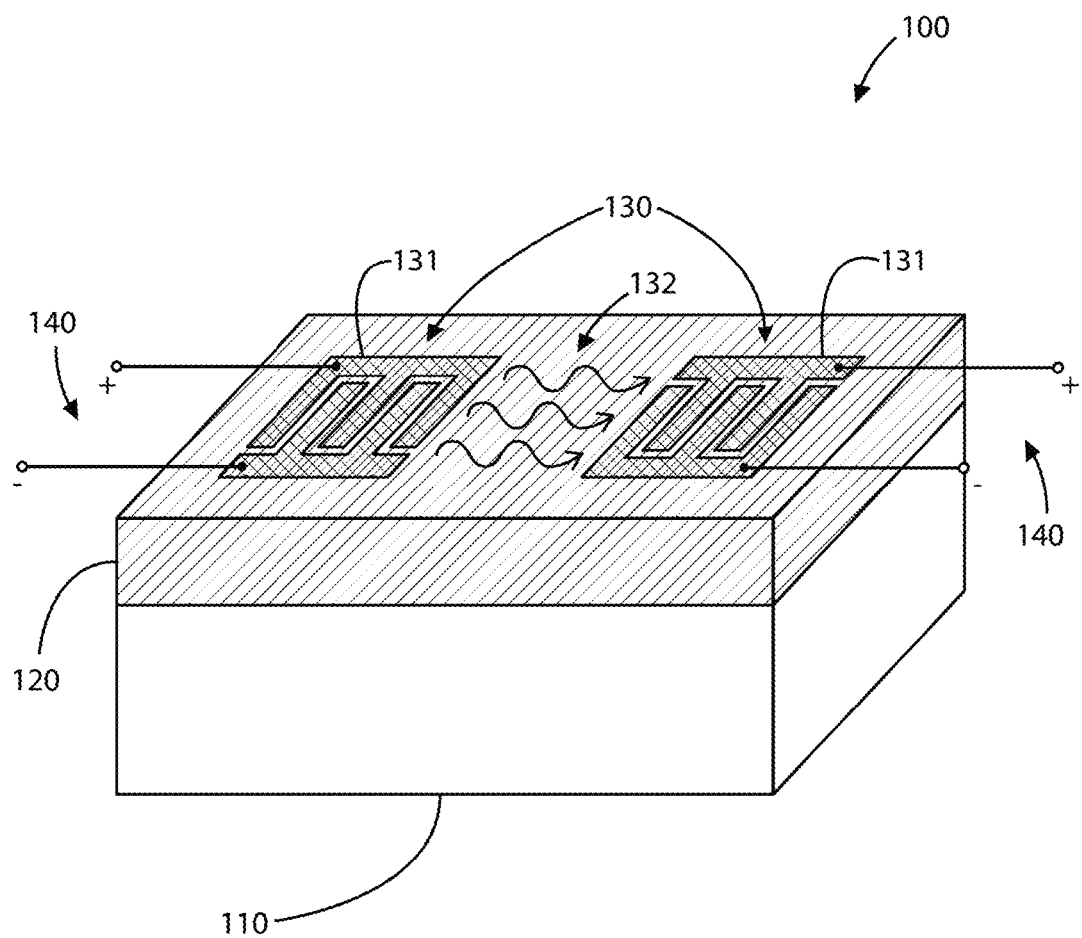
FIG. 1 is a simplified diagram illustrating a surface single crystal acoustic resonator according to an example of the present invention.

FIG. 1 is a simplified diagram illustrating a surface single crystal acoustic resonator according to an example of the present invention. This diagram is merely an example, which should not unduly limit the scope of the claims. The present surface single crystal acoustic resonator device 100 having a crystalline piezo material 120 overlying a substrate 110 is illustrated. As shown, an acoustic wave propagates in a lateral direction from a first spatial region to a second spatial region substantially parallel to a pair of electrical ports 140, which form an inter-digital transducer configuration 130 with a plurality of metal lines 131 that are spatially disposed between the pair of electrical ports 140. In an example, the electrical ports on the left side can be designated for signal input, while the electrical ports on the right side are designated for signal output. In an example, a pair of electrode regions are configured and routed to a vicinity of a plane parallel to a contact region coupled to the second electrode material.

In a SAW device example, surface acoustic waves produce resonant behavior over a narrow frequency band near 880 MHz to 915 MHz frequency band—which is a designated passband for a Europe, Middle East and Africa (EMEA) LTE enabled mobile smartphone. Depending on region of operation for the communication device, there can be variations. For example, in North American transmit bands, the resonator can be designed such that resonant behavior is near the 777 MHz to 787 MHz frequency passband. Other transmit bands, found in other regions, can be much higher in frequency, such as the Asian transmit band in the 2570 MHz to 2620 MHz passband. Further, the examples provided here are for transmit bands. In similar fashion, the passband on the receiver side of the radio front end also require similar performing resonant filters. Of course, there can be variations, modifications, and alternatives.

Other characteristics of surface acoustic wave devices include the fundamental frequency of the SAW device, which is determined by the surface propagation velocity (determined by the crystalline quality of the piezo-electric material selected for the resonator) divided by the wavelength (determined by the fingers in the interdigitated layout in FIG. 1). Measured propagation velocity (also referred to as SAW velocity) in GaN of approximately 5800 m/s has been recorded, while similar values are expected for AlN. Accordingly, higher SAW velocity of such Group III-nitrides enables a resonator to process higher frequency signals for a given device geometry.

Resonators made from Group III-nitrides are desirable as such materials operate at high power (leveraging their high critical electric field), high temperature (low intrinsic carrier concentration from their large bandgap) and high frequency (high saturated electron velocities). Such high power devices (greater than 10 Watts) are utilized in wireless infrastructure and commercial and military radar systems to name a few. Further, stability, survivability and reliability of such devices are critical for field deployment.

Further details of each of the elements provided in the present device can be found throughout the present specification and more particular below.

Figure 2:
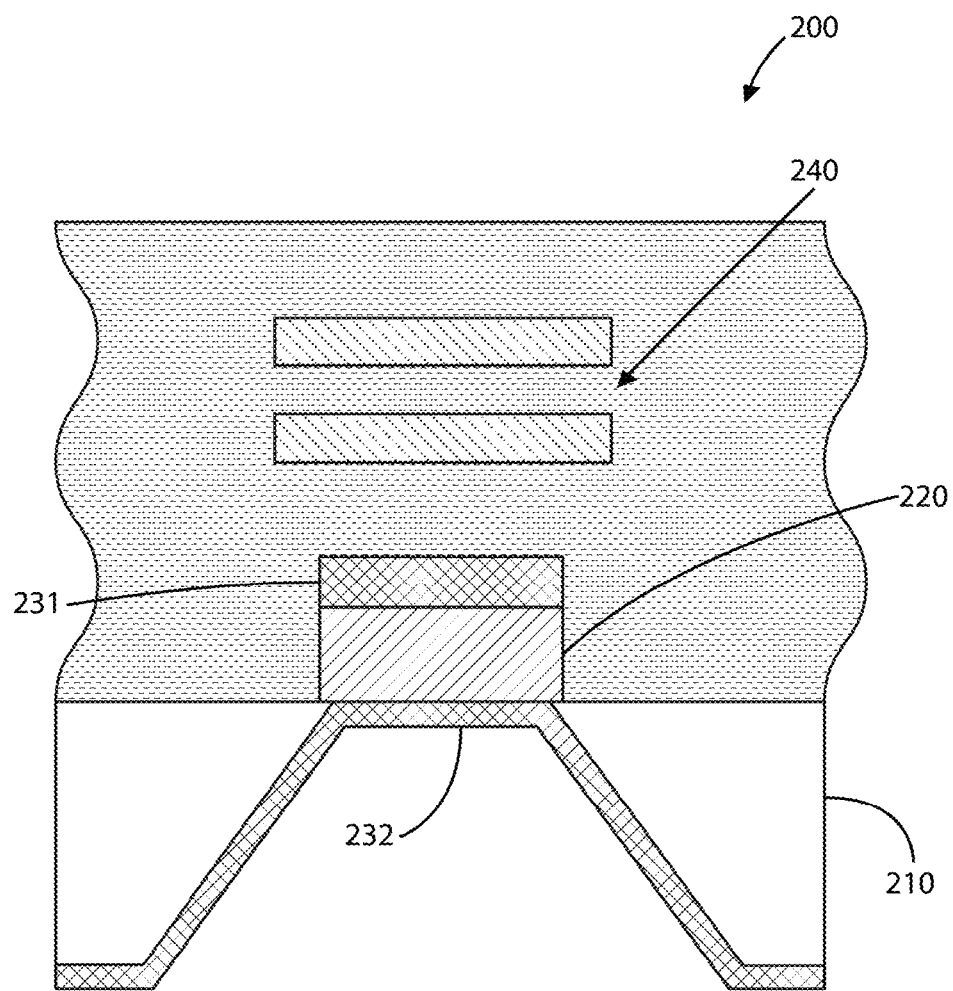
FIG. 2 is a simplified diagram illustrating a bulk single crystal acoustic resonator according to an example of the present invention.

FIG. 2 is a simplified diagram illustrating a bulk single crystal acoustic resonator according to an example of the present invention. This diagram is merely an example, which should not unduly limit the scope of the claims. The present bulk single crystal acoustic resonator device 200 having a crystalline piezo material is illustrated. As shown, an acoustic wave propagates in a vertical direction from a first spatial region to a second spatial region between an upper electrode material 231 and a substrate member 210. As shown, the crystalline piezo material 220 is configured between the upper (231) and lower (232) electrode material. The top electrode material 231 is configured underneath a plurality of optional reflector layers, which are formed overlying the top electrode 231 to form an acoustic reflector region 240.

In a bulk acoustic wave (hereinafter "BAW") device example, acoustic waves produce resonant behavior over a narrow frequency band near 3600 MHz to 3800 MHz frequency band-which is a designated passband for a LTE enabled mobile smartphone. Depending on region of operation for the communication device, there can be variations. For example, in North American transmit bands, the resonator can be designed such that resonant behavior is near the 2000 MHz to 2020 MHz frequency passband. Other transmit bands, found in other regions such as the Asian transmit band in the 2500 MHz to 2570 MHz passband. Further, the examples provided here are for transmit bands. In similar fashion, the passband on the receiver side of the radio front end also require similar performing resonant filters. Of course, there can be variations, modifications, and alternatives.

Other characteristics of single crystal BAW devices include the electromechanical acoustic coupling in the device, which is proportionate to the piezoelectricity constant (influence by the design and strain of the single crystal piezo layer) divided by the acoustic wave velocity (influenced by scattering and reflections in the piezo material). Acoustic wave velocity in GaN of over 5300 m/s has been observed. Accordingly, high acoustic wave velocity of such Group III-nitrides enables a resonator to process higher frequency signals for a given device geometry.

Similar to SAW devices, resonators made from Group III-nitrides are desirable as such materials operate at high power (leveraging their high critical electric field), high temperature (low intrinsic carrier concentration from their large bandgap) and high frequency (high saturated electron velocities). Such high power devices (greater than 10 Watts) are utilized in wireless infrastructure and commercial and military radar systems to name a few. Further, stability, survivability and reliability of such devices are critical for field deployment.

Further details of each of the materials provided in the present device can be found throughout the present specification and more particular below.

In an example, the device has a substrate, which has a surface region. In an example, the substrate can be a thickness of material, a composite, or other structure. In an example, the substrate can be selected from a dielectric material, a conductive material, a semiconductor material, or any combination of these materials. In an example, the substrate can also be a polymer member, or the like. In a preferred example, the substrate is selected from a material provided from silicon, a gallium arsenide, an aluminum oxide, or others, and their combinations.

In an example, the substrate is silicon. The substrate has a surface region, which can be in an off-set or off cut configuration. In an example, the surface region is configured in an off-set angle ranging from 0.5 degree to 1.0 degree. In an example, the substrate is <111> oriented and has high resistivity (greater than $10^3$ ohm-cm). Of course, there can be other variations, modifications, and alternatives.

In an example, the device has a first electrode material coupled to a portion of the substrate and a single crystal capacitor dielectric material having a thickness of greater than 0.4 microns (um). In an example, the single crystal capacitor dielectric material has a suitable dislocation density. The dislocation density is less than $10^{12}$ defects/$cm^2$, and greater than $10^4$ defects per $cm^2$, and variations thereof. The device has a second electrode material overlying the single crystal capacitor dielectric material. Further details of each of these materials can be found throughout the present specification and more particularly below.

In an example, the single crystal capacitor material is a suitable single crystal material having desirable electrical properties. In an example, the single crystal capacitor material is generally a gallium and nitrogen containing material such as a AlN, AlGaN, or GaN, among InN, InGaN, BN, or other group III nitrides. In an example, the single crystal capacitor material is selected from at least one of a single crystal oxide including a high K dielectric, ZnO, MgO, or alloys of MgZnGaInO. In an example, the high K is characterized by a defect density of less than $10^{12}$ defects/$cm^2$, and greater than $10^4$ defects per $cm^2$. Of course, there can be other variations, modifications, and alternatives.

In an example, the single crystal capacitor dielectric material is characterized by a surface region at least 50 um by 50 um, and variations. In an example, the surface region can be 200 um×200 um or as high as 1000 um×1000 um. Of course, there are variations, modifications, and alternatives.

In an example, the single crystal capacitor dielectric material is configured in a first strain state to compensate to the substrate. That is, the single crystal material is in a compressed or tensile strain state in relation to the overlying substrate material. In an example, the strained state of a GaN when deposited on silicon is tensile strained whereas an AlN layer is compressively strain relative to the silicon substrate.

In a preferred example, the single crystal capacitor dielectric material is deposited overlying an exposed portion of the substrate. In an example, the single crystal capacitor dielectric is lattice mismatched to the crystalline structure of the substrate, and may be strain compensated using a compressively strain piezo nucleation layer such as AlN or SiN.

In an example, the device has the first electrode material is configured via a backside of the substrate. In an example, the first electrode material is configured via a backside of the substrate. The configuration comprises a via structure configured within a thickness of the substrate.

In an example, the electrode materials can be made of a suitable material or materials. In an example, each of the first electrode material and the second electrode material is selected from a refractory metal or other precious metals. In an example, each of the first electrode material and the second electrode material is selected from one of tantalum, molybdenum, platinum, titanium, gold, aluminum tungsten, or platinum, combinations thereof, or the like.

In an example, the first electrode material and the single crystal capacitor dielectric material comprises a first interface region substantially free from an oxide bearing material. In an example, the first electrode material and the single crystal capacitor dielectric material comprises a second interface region substantially free from an oxide bearing material. In an example, the device can include a first contact coupled to the first electrode material and a second contact coupled to the second electrode material such that each of the first contact and the second contact are configured in a co-planar arrangement.

In an example, the device has a reflector region configured to the first electrode material. In an example, the device also has a reflector region configured to the second electrode material. The reflector region is made of alternating low impedance (e.g. dielectric) and high-impedance (e.g. metal) reflector layers, where each layer is targeted at one quarter-wave in thickness, although there can be variations.

In an example, the device has a nucleation material provided between the single crystal capacitor dielectric material and the first electrode material. The nucleation material is typically AlN or SiN.

In an example, the device has a capping material provided between the single crystal capacitor dielectric material and the second electrode material. In an example, the capping material is GaN.

In an example, the single crystal capacitor dielectric material preferably has other properties. That is, the single crystal capacitor dielectric material is characterized by a FWHM of less than one degree.

In an example, the single crystal capacitor dielectric is configured to propagate a longitudinal signal at an acoustic velocity of 5000 meters/second and greater. In other embodiments where strain is engineered, the signal can be over 6000 m/s and below 12,000 m/s. Of course, there can be variations, modifications, and alternatives.

The device also has desirable resonance behavior when tested using a two-port network analyzer. The resonance behavior is characterized by two resonant frequencies (called series and parallel)—whereby one exhibits an electrical impedance of infinity and the other exhibits an impedance of zero. In between such frequencies, the device behaves inductively. In an example, the device has s-parameter derived from a two-port analysis, which can be converted to impedance. From s11 parameter, the real and imaginary impedance of the device can be extracted. From s21, the transmission gain of the resonator can be calculated. Using the parallel resonance frequency along the known piezo layer thickness, the acoustic velocity can be calculated for the device.

Figure 3:
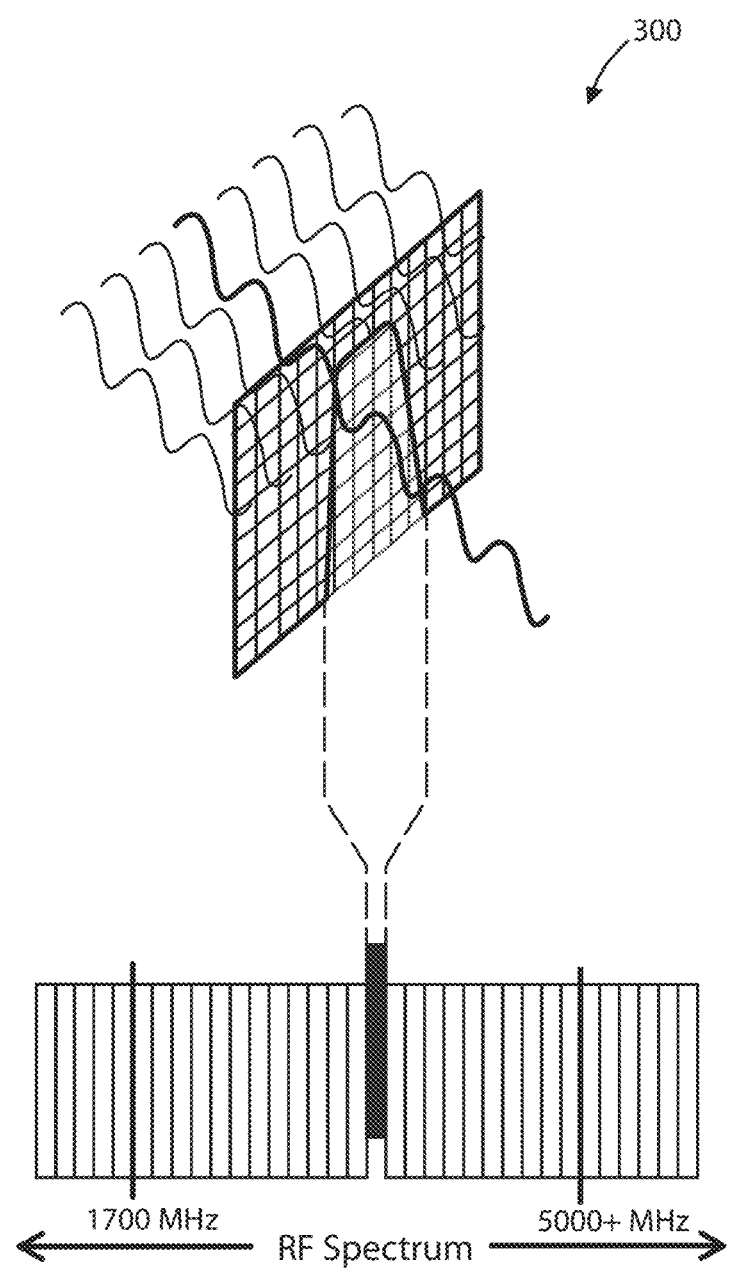
FIG. 3 is a simplified diagram illustrating a feature of a bulk single crystal acoustic resonator according to an example of the present invention.

FIG. 3 is a simplified diagram illustrating a feature of a bulk single crystal acoustic resonator according to an example of the present invention. This diagram is merely an example, which should not unduly limit the scope of the claims. As shown, diagram 300 shows the present invention applied as a band pass filter for RF signals. A specific frequency range is allowed through the filter, as depicted by the darkened block elevated from the RF spectrum underneath the wavelength illustration. This block is matched to the signal allowed through the filter in the illustration above. Single crystal devices can offer better acoustic quality versus BAW devices due to lower filter loss and relieving the specification requirements on the power amplifier. These can result benefits for devices utilizing the present invention such as extended battery, efficient spectrum use, uninterrupted caller experience, and others.

Figure 4:
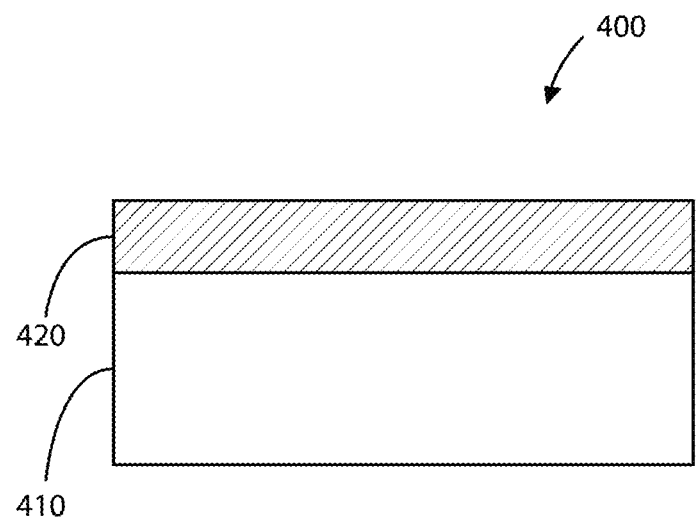
FIG. 4 is a simplified diagram illustrating a piezo structure according to an example of the present invention.

FIG. 4 is a simplified diagram illustrating a piezo structure according to an example of the present invention. This diagram is merely an example, which should not unduly limit the scope of the claims. In an example, the structure 400 is configured on a bulk substrate member 410, including a surface region. In an example, the single crystal piezo material epitaxial 420 is formed using a growth process. The growth process can include chemical vapor deposition, molecular beam epitaxial growth, or other techniques overlying the surface of the substrate. In an example, the single crystal piezo material can include single crystal gallium nitride (GaN) material, single crystal Al(x)Ga(1−x)N where 0<x<1.0 (x="Al mole fraction") material, single crystal aluminum nitride (AlN) material, or any of the aforementioned in combination with each other. Of course, there can also be modifications, alternatives, and variations. Further details of the substrate can be found throughout the present specification, and more particularly below.

Figure 5:
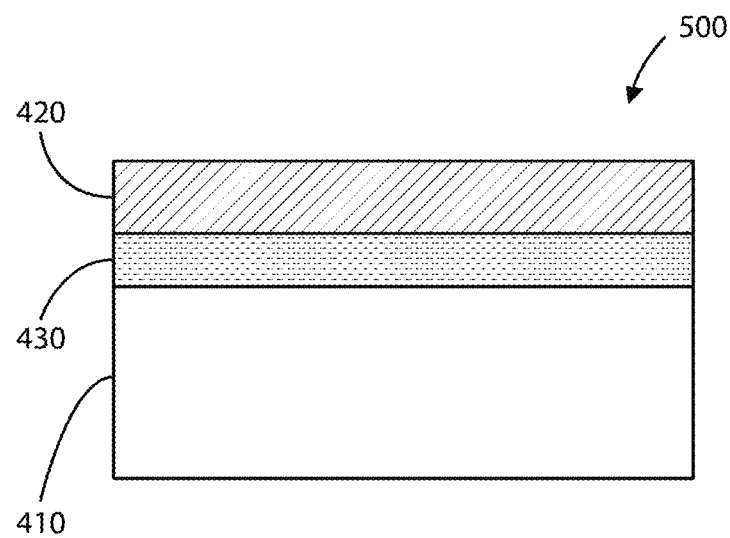
FIG. 5 is a simplified diagram illustrating a piezo structure according to an alternative example of the present invention.

FIG. 5 is a simplified diagram illustrating a piezo structure according to an alternative example of the present invention. This diagram is merely an example, which should not unduly limit the scope of the claims. In an example, the structure 500 is configured overlying a nucleation region 430, which is overlying a surface of the substrate 410. In an example, the nucleation region 430 is a layer or can be multiple layers. The nucleation region is made using a piezo-electric material in order to enable acoustic coupling in a resonator circuit. In an example, the nucleation region is a thin piezo-electric nucleation layer, which may range from about 0 to 100 nm in thickness, may be used to initiate growth of single crystal piezo material 420 overlying the surface of the substrate. In an example, the nucleation region can be made using a thin SiN or AlN material, but can include variations. In an example, the single crystal piezo material has a thickness that can range from 0.2 um to 20 um, although there can be variations. In an example, the piezo material that has a thickness of about 2 um is typical for 2 GHz acoustic resonator device. Further details of the substrate can be found throughout the present specification, and more particularly below.

Figure 6:
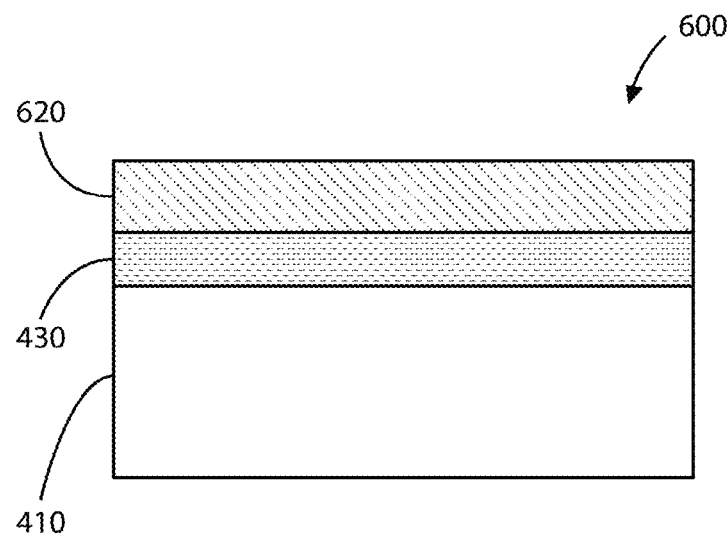
FIG. 6 is a simplified diagram illustrating a piezo structure according to an alternative example of the present invention.

FIG. 6 is a simplified diagram illustrating a piezo structure according to an alternative example of the present invention. This diagram is merely an example, which should not unduly limit the scope of the claims. In an example, the structure 600 is configured using a GaN piezo material 620. In an example, each of the regions are single crystal or substantially single crystal. In an example, the structure is provided using a thin AlN or SiN piezo nucleation region 430, which can be a layer or layers. In an example, the region is unintentional doped (UID) and is provided to strain compensate GaN on the surface region of the substrate 410. In an example, the nucleation region has an overlying GaN single crystal piezo region (having Nd—Na: between $10^{14}$/cm3 and $10^{18}$/cm3), and a thickness ranging between 1.0 um and 10 um, although there can be variations. Further details of the substrate can be found throughout the present specification, and more particularly below.

Figure 7:
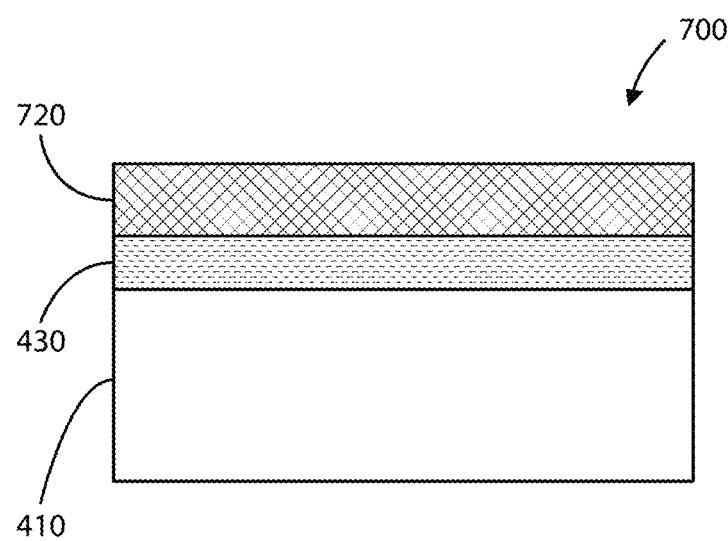
FIG. 7 is a simplified diagram illustrating a piezo structure according to an alternative example of the present invention.

FIG. 7 is a simplified diagram illustrating a piezo structure according to an alternative example of the present invention. This diagram is merely an example, which should not unduly limit the scope of the claims. As shown, the structure 700 is configured using an AlN piezo material 720. Each of the regions is single-crystal or substantially single crystal. In an example, the structure is provided using a thin AlN or SiN piezo nucleation region 430, which can be a layer or layers. In an example, the region is unintentional doped (UID) and is provided to strain compensate AlN on the surface region of the substrate 410. In an example, the nucleation region has an overlying AlN single crystal piezo region (having Nd—Na: between $10^{14}$/cm3 and $10^{18}$/cm3), and a thickness ranging between 1.0 um and 10 um, although there can be variations. Further details of the substrate can be found throughout the present specification, and more particularly below.

Figure 8:
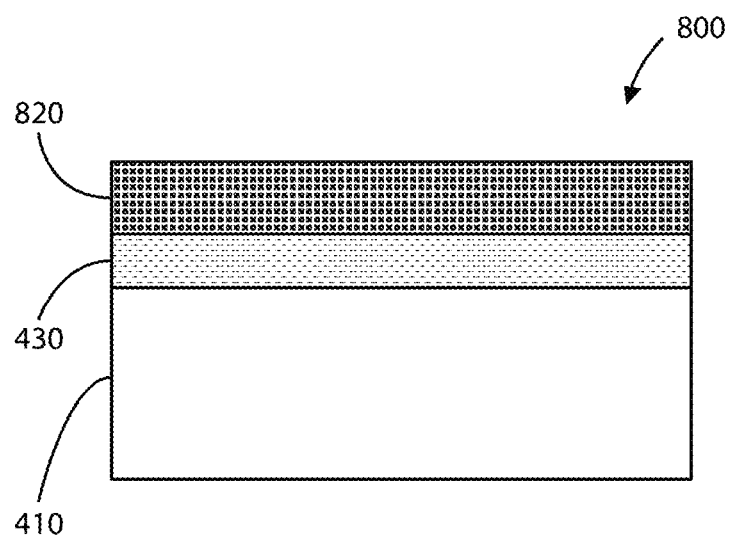
FIG. 8 is a simplified diagram illustrating a piezo structure according to an alternative example of the present invention.

FIG. 8 is a simplified diagram illustrating a piezo structure according to an alternative example of the present invention. This diagram is merely an example, which should not unduly limit the scope of the claims. As shown, the structure 800 is configured using an AlGaN piezo material 820. Each of the regions is single-crystal or substantially single crystal. In an example, the structure is provided using a thin AlN or SiN piezo nucleation region 430, which can be a layer or layers. In an example, the region is unintentional doped (UID) and is provided to strain compensate AlN on the surface region of the substrate 410. In an example, the AlGaN single crystal piezo layer where Al(x)Ga(1−x)N has Al mole composition 0<x<1.0, (Nd—Na: between $10^{14}$/cm3 and $10^{18}$/cm3), a thickness ranging between 1 um and 10 um, among other features. Further details of the substrate can be found throughout the present specification, and more particularly below.

Figure 9:
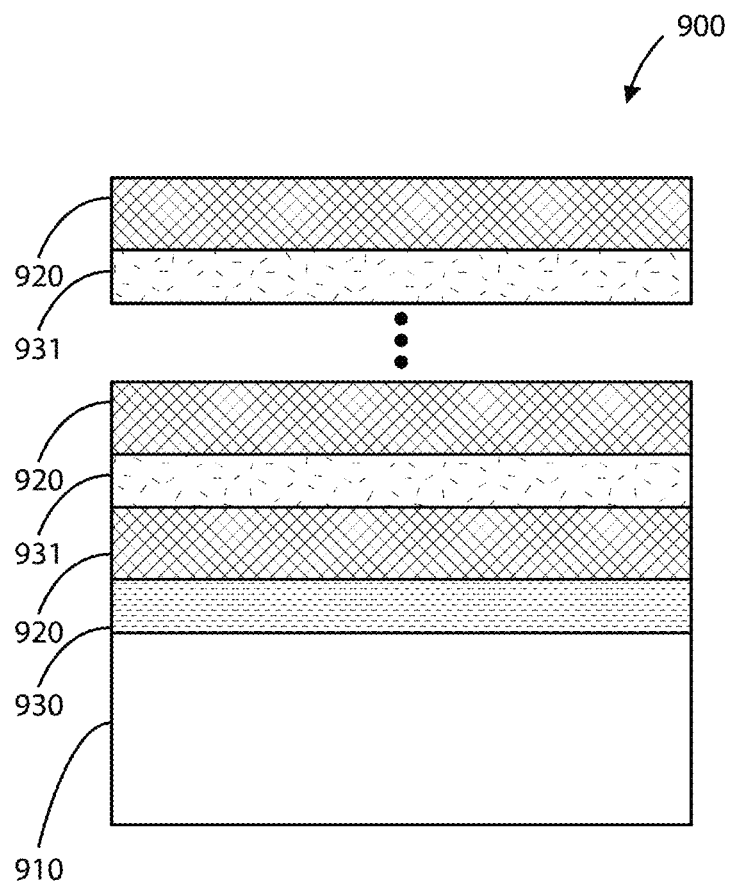
FIG. 9 is a simplified diagram illustrating a piezo structure according to an alternative example of the present invention.

FIG. 9 is a simplified diagram illustrating a piezo structure according to an alternative example of the present invention. This diagram is merely an example, which should not unduly limit the scope of the claims. The structure 900 is configured using an AlN/AlGaN piezo material 920. Each of the regions is single-crystal or substantially single crystal. In an example, the structure is provided using a thin AlN or SiN piezo nucleation region 930, which can be a layer or layers. In an example, the region is unintentional doped (UID) and is provided to strain compensate AlN on the surface region of the substrate 910. In an example, one or more alternating stacks are formed overlying the nucleation region. In an example, the stack includes AlGaN/AlN single crystal piezo layer where Al(x)Ga(1−x)N has Al mole composition 0<x<1.0; (Nd—Na: between 1014/cm3 and 1018/cm3), a thickness ranging between 1.0 um and 10 um; a AlN (1 nm<thickness<30 nm) serves to strain compensate lattice and allow thicker AlGaN piezo layer. In an example, the final single crystal piezo layer is AlGaN. In an example, the structure has a total stack thickness of at least 1 um and less than 10 um, among others. Further details of the substrate can be found throughout the present specification, and more particularly below.

Figure 10:
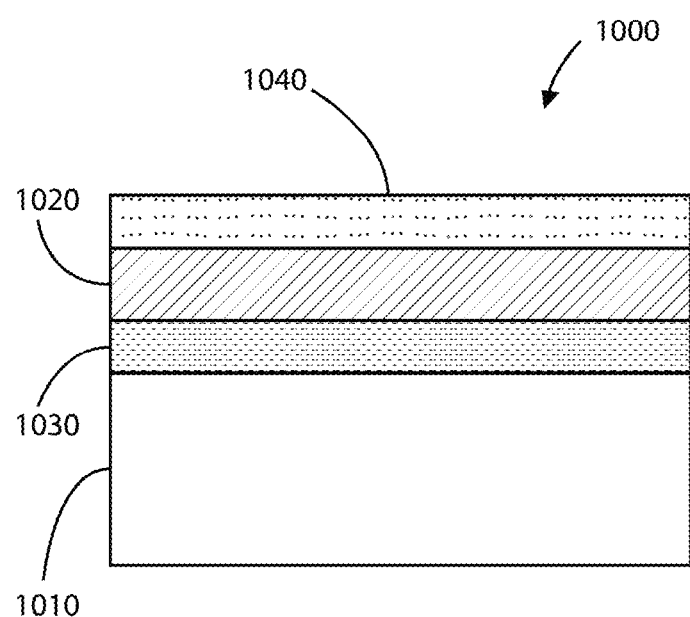
FIG. 10 is a simplified diagram illustrating a piezo structure according to an alternative example of the present invention.

FIG. 10 is a simplified diagram illustrating a piezo structure according to an alternative example of the present invention. This diagram is merely an example, which should not unduly limit the scope of the claims. As shown, the structure 1000 has an optional GaN piezo-electric cap layer or layers 1040. In an example, the cap layer 1040 or region can be configured on any of the aforementioned examples, among others. In an example, the cap region can include at least one or more benefits. Such benefits include improved electro-acoustic coupling from topside metal (electrode 1) into piezo material, reduced, surface oxidation, improved manufacturing, among others. In an example, the GaN cap region has a thickness ranging between 1 nm-10 nm, and has Nd—Na: between $10^{14}$/cm3 and $10^{18}$/cm3, although there can be variations. Further details of the substrate can be found throughout the present specification, and more particularly below.

Figure 11:
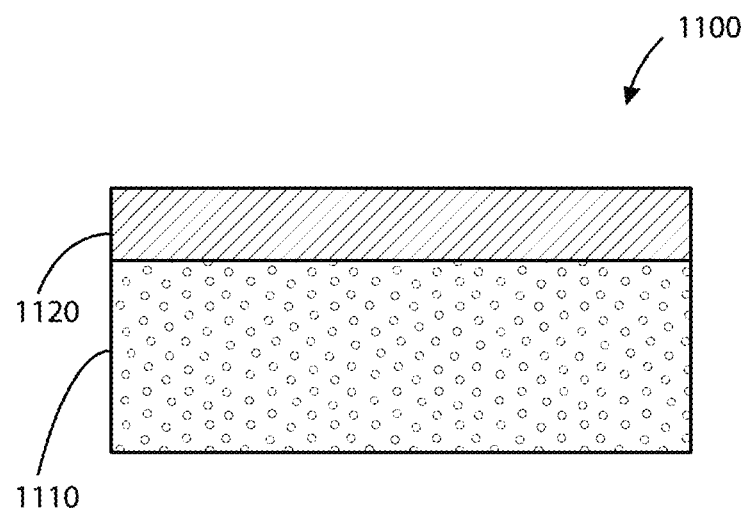
FIG. 11 is a simplified diagram of a substrate member according to an example of the present invention.

FIG. 11 is a simplified diagram of a substrate member according to an example of the present invention. This diagram is merely an example, which should not unduly limit the scope of the claims. In an example, the single crystal acoustic resonator material 1120 can be a single crystal piezo material epitaxial grown (using CVD or MBE technique) on a substrate 1110. The substrate 1110 can be a bulk substrate, a composite, or other member. The bulk substrate 1110 is preferably gallium nitride (GaN), silicon carbide (SiC), silicon (Si), sapphire (Al2O3), aluminum nitride (AlN), combinations thereof, and the like.

Figure 12:
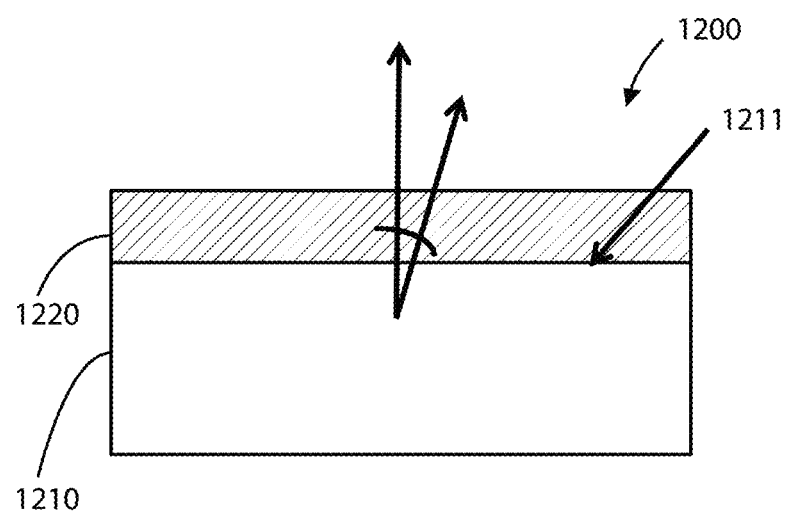
FIG. 12 is a simplified diagram of a substrate member according to an example of the present invention.

FIG. 12 is a simplified diagram of a substrate member according to an example of the present invention. This diagram is merely an example, which should not unduly limit the scope of the claims. In an example, the single crystal acoustic resonator material 1220 can be a single crystal piezo material epitaxial grown (using CVD or MBE technique) on a substrate 1210. The substrate 1210 can be a bulk substrate, a composite, or other member. The bulk substrate 1210 is preferably gallium nitride (GaN), silicon carbide (SiC), silicon (Si), sapphire (Al2O3), aluminum nitride (AlN), combinations thereof, and the like. In an example, the surface region of the substrate is bare and exposed crystalline material.

FIG. 13 is a simplified table illustrating features of a conventional filter compared against the present examples according to examples of the present invention. As shown, the specifications of the "Present Example" versus a "Conventional" embodiment are shown with respect to the criteria under "Filter Solution".

In an example, the GaN, SiC and Al2O3 orientation is c-axis in order to improve or even maximize a polarization field in the piezo-electric material. In an example, the silicon substrate orientation is <111> orientation for same or similar reason. In an example, the substrate can be off-cut or offset. While c-axis or <111> is nominal orientation, an offcut angle between +/−1.5 degrees may be selected for one or more of the following reasons: (1) controllability of process; (2) maximization of K2 of acoustic resonator, and other reasons. In an example, the substrate is grown on a face, such as a growth face. A Ga-face is preferred growth surface (due to more mature process). In an example, the substrate has a substrate resistivity that is greater than 104 ohm-cm, although there can be variations. In an example, the substrate thickness ranges 100 um to 1 mm at the time of growth of single crystal piezo deposition material. Of course, there can be variations, modifications, and alternatives.

As used herein, the terms "first" "second" "third" and "nth" shall be interpreted under ordinary meaning. Such terms, alone or together, do not necessarily imply order, unless understood that way by one of ordinary skill in the art. Additionally, the terms "top" and "bottom" may not have a meaning in reference to a direction of gravity, while should be interpreted under ordinary meaning. These terms shall not unduly limit the scope of the claims herein.

As used herein, the term substrate is associated with Group III-nitride based materials including GaN, InGaN, AlGaN, or other Group III containing alloys or compositions that are used as starting materials, or AlN or the like. Such starting materials include polar GaN substrates (i.e., substrate where the largest area surface is nominally an (h k 1) plane wherein h=k=0, and 1 is non-zero), non-polar GaN substrates (i.e., substrate material where the largest area surface is oriented at an angle ranging from about 80-100 degrees from the polar orientation described above towards an (h k 1) plane wherein 1=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above towards an (h k 1) plane wherein 1=0, and at least one of h and k is non-zero.).

As shown, the present device can be enclosed in a suitable package.

FIGS. 14-26 illustrate a manufacturing method for a single crystal acoustic resonator device in an example of the present invention. This illustration is merely an example, and should not unduly limit the scope of the claims herein.

Referring to these Figures, an example of a manufacturing process can be briefly described below:
1. Start;
2. Provide a substrate member, e.g., 150 mm or 200 mm diameter material, having a surface region;
3. Treat the surface region;
4. Form an epitaxial material comprising single crystal piezo material overlying the surface region to a desired thickness;
5. Pattern the epitaxial material using a masking and etching process to form a trench region by causing formation of an exposed portion of the surface region through a pattern provided in the epitaxial material;
6. Form topside landing pad metal, which may include a stack that has a metal layer that reacts slowly with etchants in a backside substrate etching process, as defined below.
7. Form topside electrode members, including a first electrode member overlying a portion of the epitaxial material, and a second electrode member overlying the topside landing pad metal;
8. Selectively form topside overlay metallization such as Ti/Al (100 Å/2 um) for (a) reduce line losses and (b) provides thick metal to attach cu-pillar, which will be later described.
9. Form passivation material overlying upper region of patterned material;
10. Mask and remove (via etching) selective portions of the passivation material to expose portions of the overlay topside metallization to form bonding pads;
11. Mask and remove (via etching) a portion of the substrate from the backside to form a first trench region exposing a backside of the epitaxial material overlying the first electrode member, and a second trench region exposing a backside of the landing pad metal;
12. Optionally, remove mask from backside;
13. Mask and remove (via) etching portions of the backside to expose a backside of the epitaxial material overlying the first electrode member, and to expose a backside of the landing pad, while causing the first trench region to include a first step region and the second trench region to include a second step region, while maintaining a mechanical rib structure between the first trench region and the second trench region;
14. Form backside resonator metal material for the second electrode overlying the exposed portion of the epitaxial material (or piezo membrane) to form a connection from the epitaxial material to the backside of the landing pad metal coupled to the second electrode member overlying the topside landing pad metal;
15. Form resonator active area using a masking and etching process, while electrically and spatially isolating the first electrode member from the second electrode member on the top side, while also fine tuning the resonance capacitor; and
16. Perform other steps, as desired.

The aforementioned steps are provided for the formation of a resonator device using a single crystal capacitor dielectric. As shown, a pair of electrode members is configured to provide for contact from one side of the device. One of the electrode members uses a backside contact, which is coupled to a metal stack layer to configure the pair of electrodes. Of course, depending upon the embodiment, steps or a step can be added, removed, combined, reordered, or replaced, or has other variations, alternatives, and modifications. Further details of the present manufacturing process can be found throughout the present specification, and more particularly below.

Figure 14:
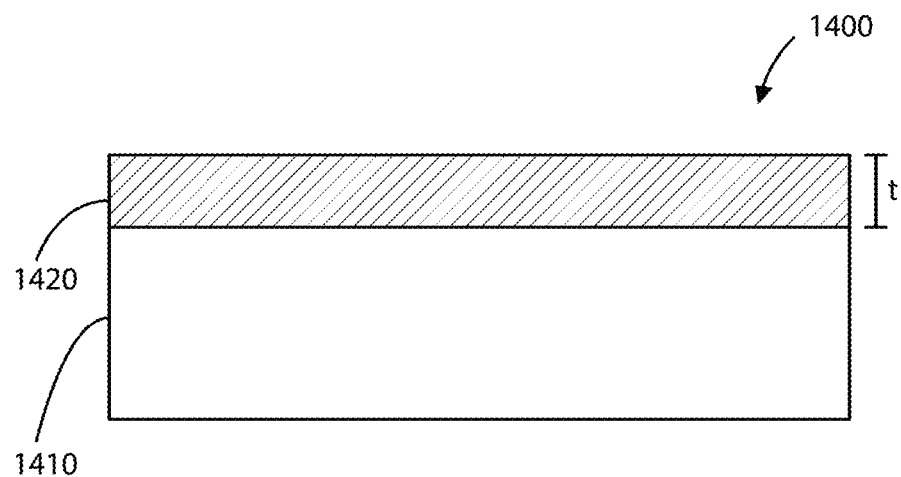
FIGS. 14 to 26B illustrate a manufacturing method for a single crystal acoustic resonator device according to an embodiment of the present invention.

As shown in FIG. 14, the method begins by providing a substrate member 1410. The substrate member has a surface region. In an example, the substrate member thickness is 400 um, which can have a diameter of 150 mm or 200 mm diameter material, although there can be variations from 50 mm to 300 mm.

In an example, the surface region of the substrate member is treated. The treatment often includes cleaning and/or conditioning. In an example, the treatment occurs in an MOCVD or LPCVD reactor with ammonia gas flowing at high temperature (e.g. in the range from 940° C. to 1100° C.) at a pressure ranging from one-tenth of an atmosphere to one atmosphere. In LPCVD process, dichlorosilane (DCS) is used (with or without the addition of Ammonia) to clean and prepare a surface for single crystal growth. Depending upon the embodiment, other treatment processes can also be used.

In an example, the method includes formation of an epitaxial material comprising single crystal piezo material 1420 overlying the surface region to a desired thickness, as shown. Using a configuration of Trimethylgallium (TMG), Trimethylaluminium (TMA), ammonia (NH3) and hydrogen (H2) gases, the epitaxial material is grown under high temperature in the range of 940° C. to 1100° C. in an atmospheric controlled environment using a MOCVD or LPCVD growth apparatus to a thickness ranging from 0.4 um to 7.0 um, depending on target resonance frequency of the capacitor device. The material also has a defect density of $10^4$ to $10^{12}$ per cm2, although there can be variations.

Figure 15:
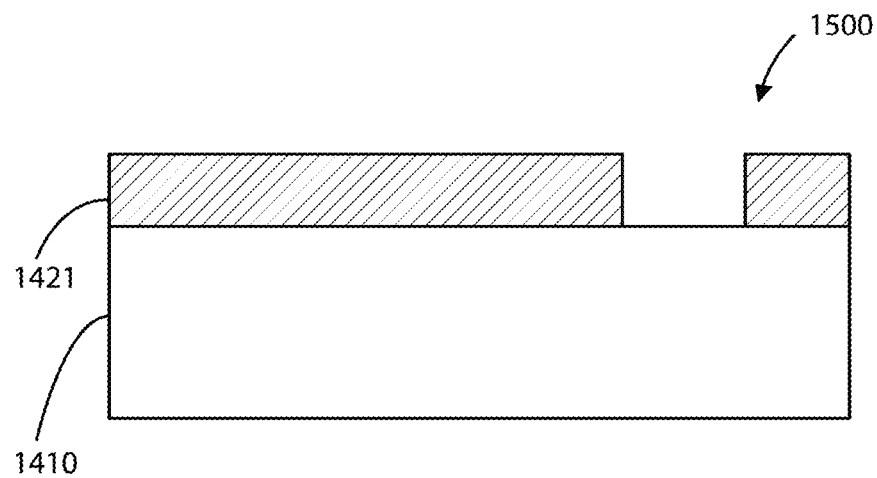

In an example, the epitaxial material 1420 is patterned, as shown in FIG. 15. Patterning involves a masking and etching process. The mask is often 1-3 um of photoresist. Etching uses chlorine-based chemistries (gases may include BCl3, Cl2, SF6 and/or argon) in an RIE or ICP etch tool, under controlled temperature and pressure conditions to adjust the etch rate and sidewall profile. The patterning forms a trench region (or via structure) by causing formation of an exposed portion of the surface region through a pattern provided in the epitaxial material 1421.

Figure 16:
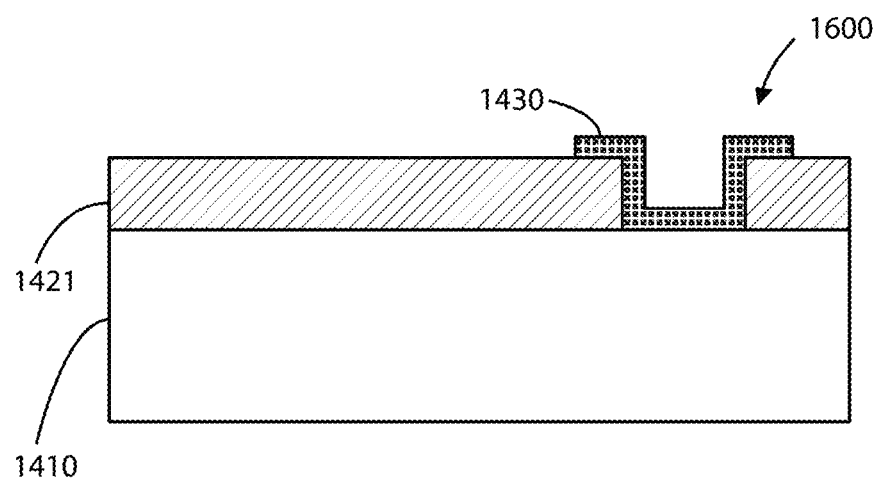

In an example, the method forms a topside landing pad metal 1430, shown in FIG. 16, which may include a stack that has a metal layer that reacts slowly with etchants in a backside substrate etching process, as defined below. In an example, the metal is a refractory metal (such as tantalum, molybdenum, tungsten) or other metal (such as gold, aluminum, titanium or platinum). The metal is used subsequently as a stop region for a backside etch process, as noted.

Figure 17:
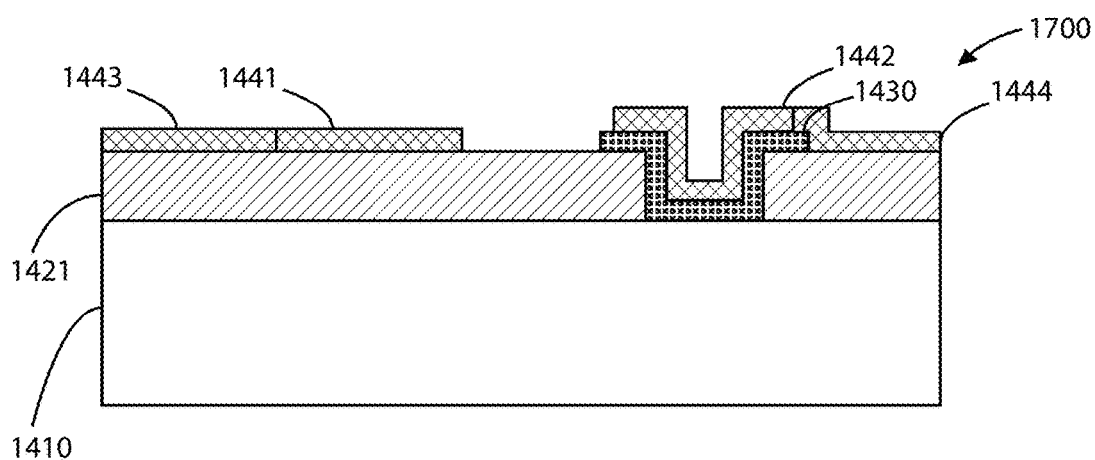
Figure 18:
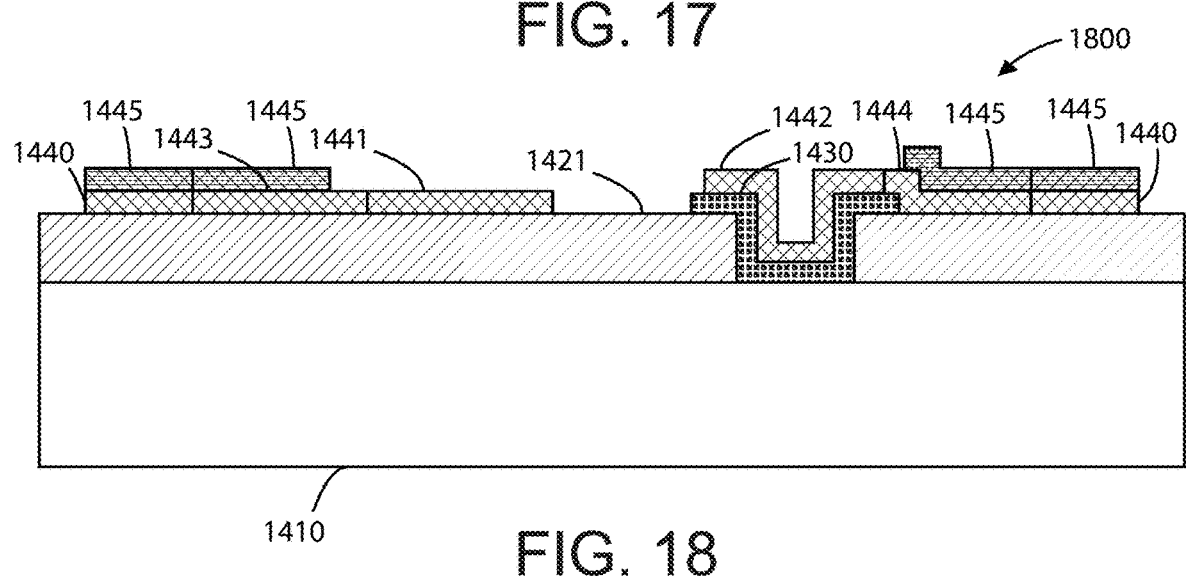

In an example, the method forms a topside metal structure, as shown in FIG. 17. The structure has topside electrode members, including a first electrode member 1441 overlying a portion of the epitaxial material, and a second electrode member 1442 overlying the topside landing pad metal 1430, as shown. The metal structure can include an interconnect feed metal 1443 and a metal interconnect 1444. The metal structure is made using a refractory metal (such as tantalum, molybdenum, tungsten), and has a thickness of 300 nm, chosen such, when combined with the piezo material thickness, defines the resonant frequency of the capacitor device. Furthermore, FIG. 18 shows an expanded view with bonding contacts 1440 and overlay metal materials 1445.

Figure 19:
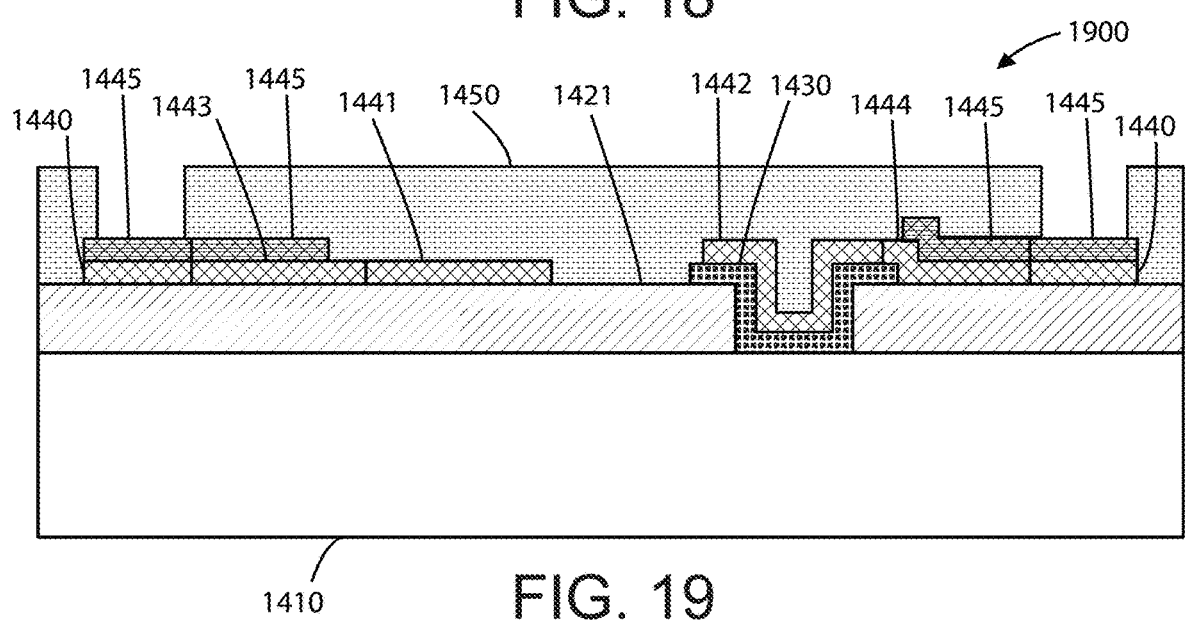
Figure 20:
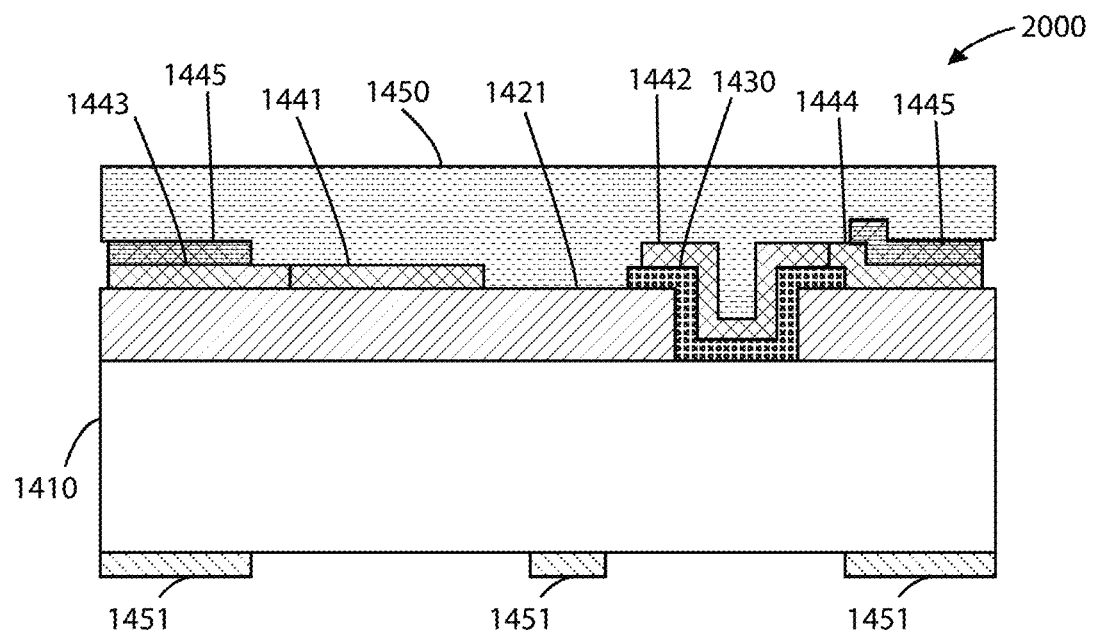
Figure 21:
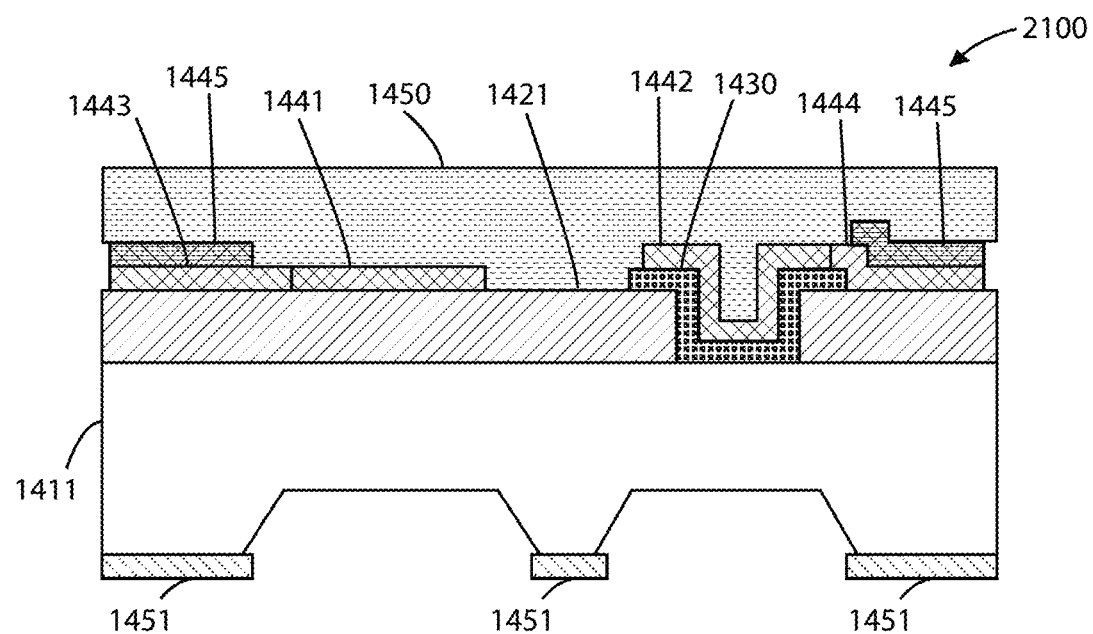
Figure 22:
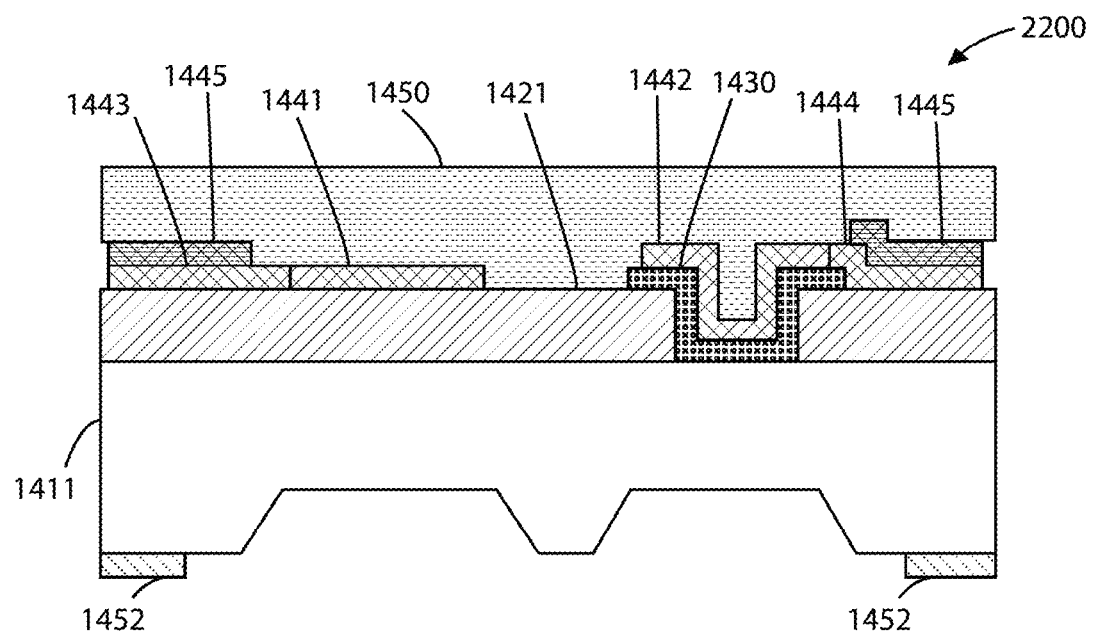
Figure 23:
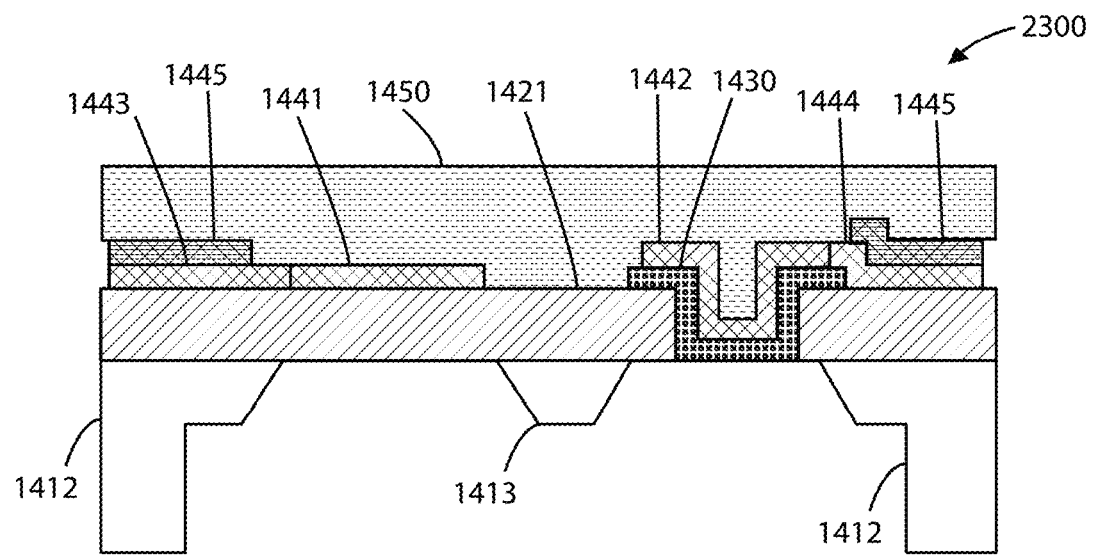

The method forms a thickness of protecting material 1450, as shown in FIG. 19. In an example, the method forms a combination of silicon dioxide, which forms a conforming structure, and an overlying silicon nitride capping material. The silicon dioxide and silicon nitride materials are formed using a combination of silane, nitrogen and oxygen sources and deposited using a PECVD chamber. In an example, the method also may include other steps or other materials, as desirable.

In an example, the method includes a mask and remove (via etching) to form contact openings. That is, selective portions of the passivation material are removed to expose portions of the overlay topside metallization 1445 to form bonding pads. As shown, the passivation material has openings for the bonding pads.

In an example, the method performs backside processing, by flipping the substrate top-side down. In an example, the method includes a patterning process of the backside of the substrate. The process uses a mask and removal process via etching a portion of the substrate from the backside to form a first trench region exposing a backside of the epitaxial material overlying the first electrode member, and a second trench region exposing a backside of the landing pad metal. In an example, etching is performed using chlorine-based or fluorine-based gas in either an RIE or ICP reactor with temperature and pressure defined to control etch rate, selectivity and sidewall slope.

Referring to the FIGS. 20-23, the method performs a multiple step backside process. As shown, the method includes a mask 1451 and etching process to remove a portion of the substrate 1411 from the backside to form a first trench region exposing a backside of the epitaxial material overlying the first electrode member, and a second trench region exposing a backside of the landing pad metal. The mask is then removed. The method includes another mask 1452 and etching process, shown in FIG. 23, to process portions of the backside of the substrate 1411 to expose a backside of the epitaxial material 1421 overlying the first electrode 1441 member, and to expose a backside of the landing pad 1430, while causing the first trench region to include a first step region and the second trench region to include a second step region. As shown, the method also maintains a mechanical rib structure 1413 between the first trench region and the second trench region.

Figure 24:
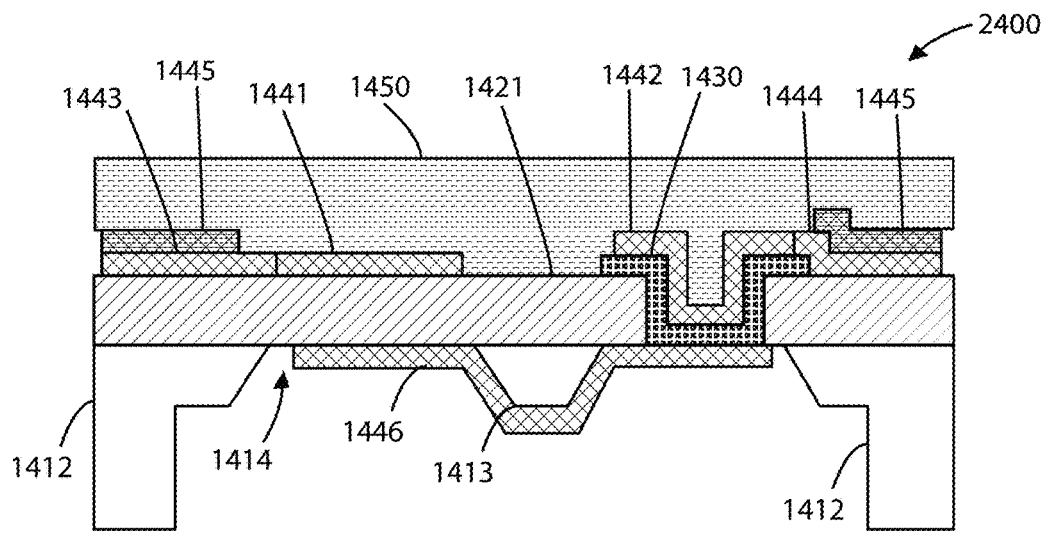

Next in FIG. 24, the method includes formation of a backside resonator metal material 1446 or backside electrode for the second electrode 1442 overlying the exposed portion of the epitaxial material 1421 (or piezo membrane) to form a connection from the epitaxial material 1420 to the backside of the landing pad metal 1430 coupled to the second electrode member 1442 overlying the topside landing pad metal 1430. As shown, there can be an intentional gap 1414 between the backside electrode 1446 and a portion of the substrate 2512.

As shown, the piezo membrane is sandwiched between the pair of electrodes 1441-1442 and 1446, which are configured from the top-side and backside of the substrate member 1412. The member is <111> oriented silicon substrate with a resistivity of greater than 10 ohm-cm.

In an example, the method forms or patterns the resonator active area using a masking and etching process. The end objective is to electrically and spatially isolate the first electrode member from the second electrode member on the top side, while also fine tuning the resonance capacitor. In an example, the resonator active area is 200 um by 200 um. The patterning uses chlorine-based or fluorine-based RIE or ICP etching technique.

In an example, the present method can also include one or more of these processes for formation of the upper electrode structures, passivation material, and backside processing. In an example, the present substrate including overlying structures can include a surface clean using HCl:H2O (1:1) for a predetermined amount of time, followed by rinse and load into evaporation tool.

In the evaporation tool to form the electrode metallization, the method includes a molybdenum (Mo) metal (3000 Å) using an e-beam evaporation process technique on a masked and patterned top side of the single crystal piezo material. In an example, if desired, a thin titanium adhesion metal (<100 Å) can be deposited prior to formation of the Mo metal. Such titanium metal serves as a glue layer, among other features. In an example, the method performs a mask and pattern process to define Mo in field areas (leaving Mo in probe pad, coplanar waveguide (CPW) interconnect, top-plate/first electrode, via landing pad/second electrode, and alignment mark areas. In an example, titanium-aluminum (100 Å/4 um) is deposited on Mo metal in probe pad and CPW areas. In an example, Ti/Al is formed on the landing pad for subsequently deposited copper-tin metal pillars for wafer-level flip-chip package—CuSn pillars and die sawing are deposited. In an example, the method forms a dielectric passivation (25 um of spin-on polymer photo-dielectric (ELECTRA WLP SH32-1-1) of top-side surface, or alternatively a combination of SiN or SiO2 is formed overlying the top surface.

Figure 25:
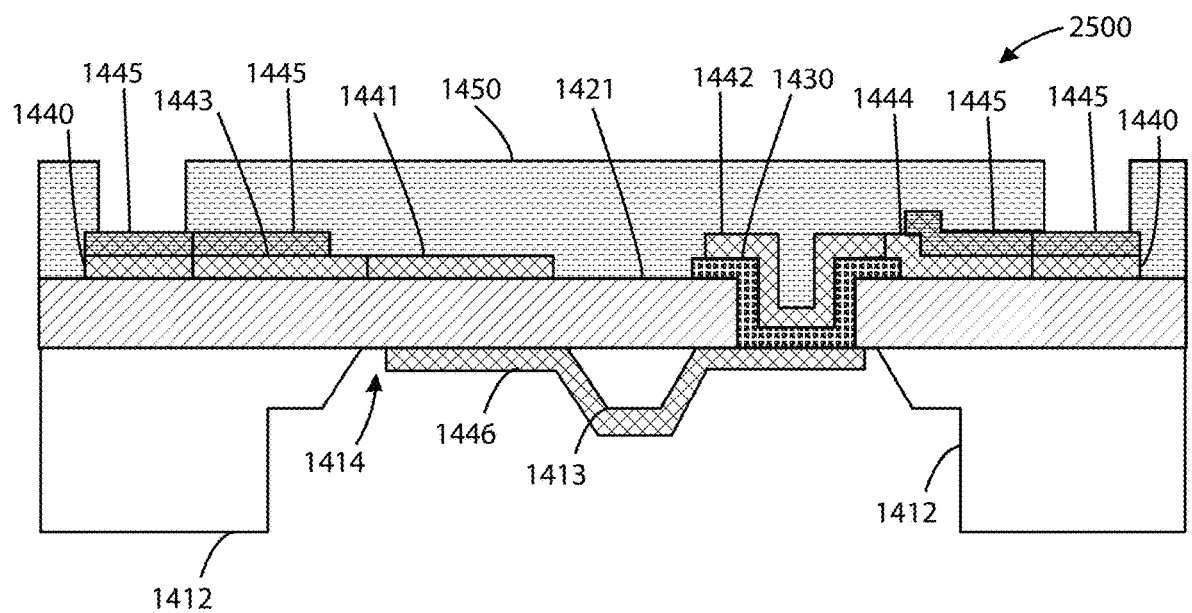

In an example, the method includes patterning to open bond pads and probe pads by exposing photo-dielectric and developing away dielectric material 1450 on pads, as shown in FIG. 25. The patterning process completes an upper region of the substrate structure, before backside processing is performed. Further details of the present method can be found throughout the present specification, and more particularly below.

Figure 26A:
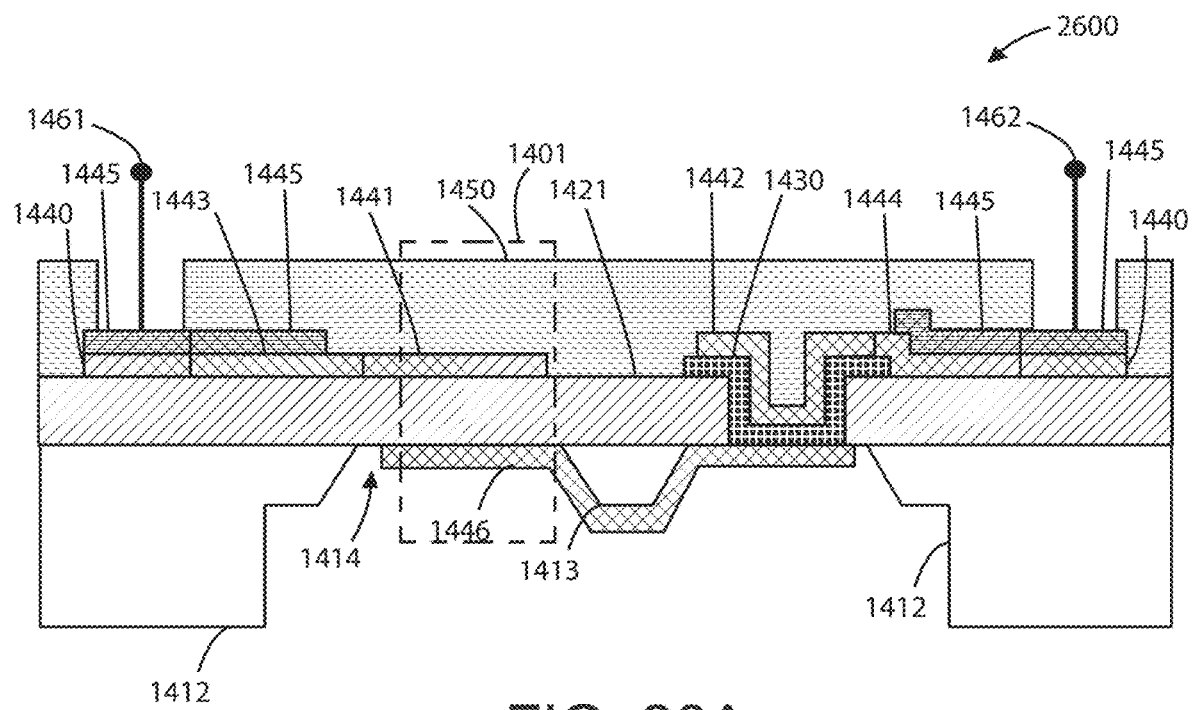
Figure 26B:
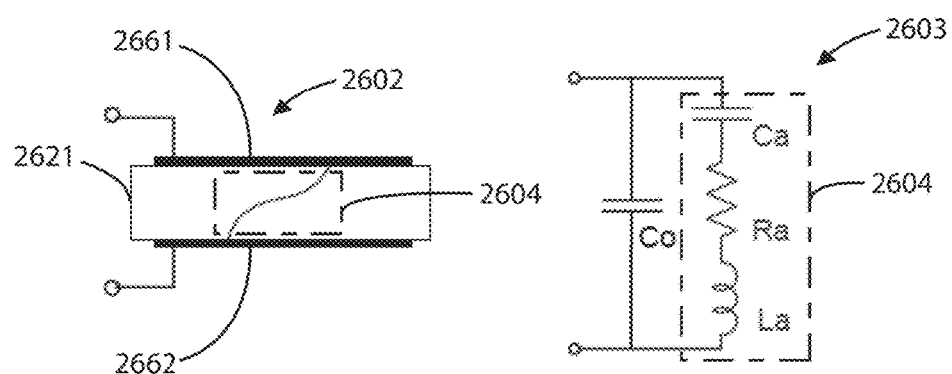

FIG. 26A shows an example of the final device 2600 with electrode connections 1461 and 1462 coupled to the bonding pads, and the intrinsic device 1401 marked by the dotted box. FIG. 26B shows device 2602, which is a simplified representation of device 2600, with epitaxial material 2621, a first electrode 2661, a second electrode 2662, and interconnection 2604. FIG. 26B also shows equivalent circuit 2603 with the interconnection 2604 represented within the dotted box.

In an example, the substrate is provided on a flip mount wafer and mount (using photoresist) onto a carrier wafer to begin backside process. In an example, the backside processing uses a multi-step (e.g., two step) process. In an example, the wafer is thinned from about 500 um to about 300 um and less using backside grinding process, which may also include polishing, and cleaning. In an example, the backside is coated with masking material, such as photoresist, and patterned to open trench regions for the piezo material and the landing pad regions. In an example, the method incudes a shallow etch process into the substrate, which can be silicon for example. In an example, the method coats the backside with photoresist to open and expose a backside region of the piezo material, which exposes a full membrane area, which includes enclosed the piezo material and the landing pad areas. In an example, the method also performs an etch until the piezo material and the landing pads are exposed. In an example, the "rib" support is feature which results from 2-step process, although there can be variations, as further described below.

In an example, the backside is patterned with photoresist to align the backside pad metal (electrode #2), interconnect and landing pad. In an example, the backside is treated using a cleaning process using dilute HCl:H2O (1:1), among other suitable processes. In an example, the method also includes deposition of about 3000 Å of Mo metal in selective areas, provided that the backside of the wafer is patterned with metal in a selective manner and not blanket deposition. In an example, the metal is formed in limited areas to reduce parasitic capacitance and enables routing of backside for circuit implementation, which is beneficial for different circuit node interconnections. In an example, if desired, a thin titanium adhesion metal (<100 Å) can be deposited prior to Mo as a glue material.

In an example, the method also includes formation of a dielectric passivation (25 um of spin-on polymer photo-dielectric (e.g., ELECTRA WLP SH32-1-1) of backside side surface for mechanical stability. In an example in an alternative example, the method includes deposition of SiN and/or $SiO_2$ to fill the backside trench region to provide suitable protection, isolation, and provide other features, if desired.

In an example, the method then separates and/or unmounts the completed substrate for transfer into a wafer carrier. The completed substrate has the devices, and overlying protection materials. In an example, the substrate is now ready for saw and break, and other backend processes such as wafer level packaging, or other techniques. Of course, there can be other variations, modifications, and alternatives.

FIGS. 27-32 illustrate a manufacturing method for wafer scale packaging of a wafer comprising a plurality single crystal acoustic resonator devices in an example of the present invention. This illustration is merely an example, and should not unduly limit the scope of the claims herein.

Referring to these Figures, an example of a manufacturing process can be briefly described below:
1. Start;
2. Provide a partially completed semiconductor substrate, the semiconductor substrate comprising one-or-more (N) single crystal acoustic resonator devices, each of the N devices having a first electrode member and a second electrode member, and an overlying passivation material, the N devices being numbered $R_1$, $R_2$, ... $R_{N-1}$, and $R_N$;
3. For at least each of $R_1$ and $R_N$, form a repassivation material overlying the passivation material, the repassivation material having a first region exposing the first electrode member and a second region expositing the second electrode member, such as those described in the present specification but can include variations;
4. Form an under metal material overlying the repassivation material and covering the first region and the second region such that the first electrode member and the second electrode member are each in electrical and physical contact with the under metal material;
5. Form a thickness of resist material overlying the under metal material to cause a substantially planarized surface region;
6. Pattern the substantially planarized surface region of the thickness of resist material to expose a first region corresponding to the first electrode member and a second region corresponding to the second electrode member;
7. Fill the first region and the second region using a deposition process to form a first copper pillar structure overlying the first electrode member and a second copper pillar structure overlying the second electrode member;
8. Form a solder material overlying the first copper pillar structure and the second copper pillar structure;
9. Process the thickness of resist material to substantially remove the thickness of resist material and expose the under metal material;
10. Remove any exposed portions of the under metal material;
11. Subject the solder material on the first copper pillar structure and the second copper pillar structure to cause formation of a first solder bump structure overlying the first copper pillar structure and a second solder bump structure overlying the second copper pillar structure for at least each of $R_1$ and $R_N$.
12. Perform other steps, as desired.

The aforementioned steps are provided for the formation of a packaged resonator device including a single crystal capacitor dielectric. Of course, depending upon the embodiment, steps or a step can be added, removed, combined, reordered, or replaced, or has other variations, alternatives, and modifications. Further details of the present manufacturing process can be found throughout the present specification, and more particularly below.

Referring to these Figures, the method includes providing a partially completed semiconductor substrate. In an example, the semiconductor substrate comprises one-or-more (N) single crystal acoustic resonator devices. Each of the N devices has a first electrode member and a second electrode member, and an overlying passivation material. In an example, the N devices are numbered $R_1$, $R_2$, ... $R_{N-1}$, and $R_N$. In an example, the partially completed semiconductor substrate can be the one described in the aforementioned text.

Figure 27:
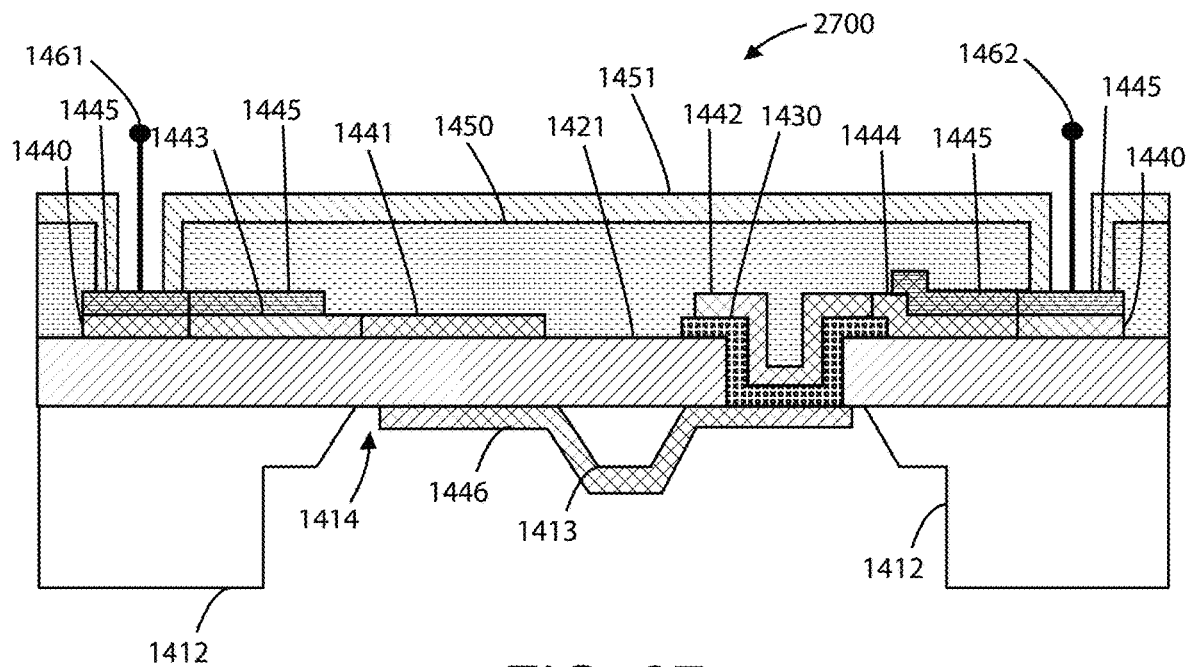
FIGS. 27 to 32 illustrate a manufacturing method for wafer scale packaging of a wafer comprising a plurality of single crystal acoustic resonators devices according to an embodiment of the present invention.

In an example, for at least each of $R_1$ and $R_N$, the method includes forming a repassivation material 1451 overlying the passivation material, as shown in FIG. 27. In an example, the repassivation material has a first region exposing the first electrode member and a second region exposing the second electrode member, such as those described in the present specification but can include variations.

In an example, before depositing the repassivation material, or coating, the method performs a surface cleaning process, such as oxygen (O2) plasma. Other cleaning processes include dilute acids (such as HCl:H20) or ammonia and provide removing of oxides, polymer residue. Of course, there can be variations.

In an example, the repassivation coating 1451 is deposited using suitable techniques. In an example, the repassivation coating can be a BCB (Cyclotene 4024-40 material), sold by DOW Chemical or other companies. In an example, the coating has a thickness ranging from 1 um to 25 um and is preferably about 5 um, although there can be variations. In an example, the method also includes an align, expose, develop, and cure process. The method also includes a cleaning process, such as oxygen (O2) plasma. Of course, there can be variations.

Figure 28:
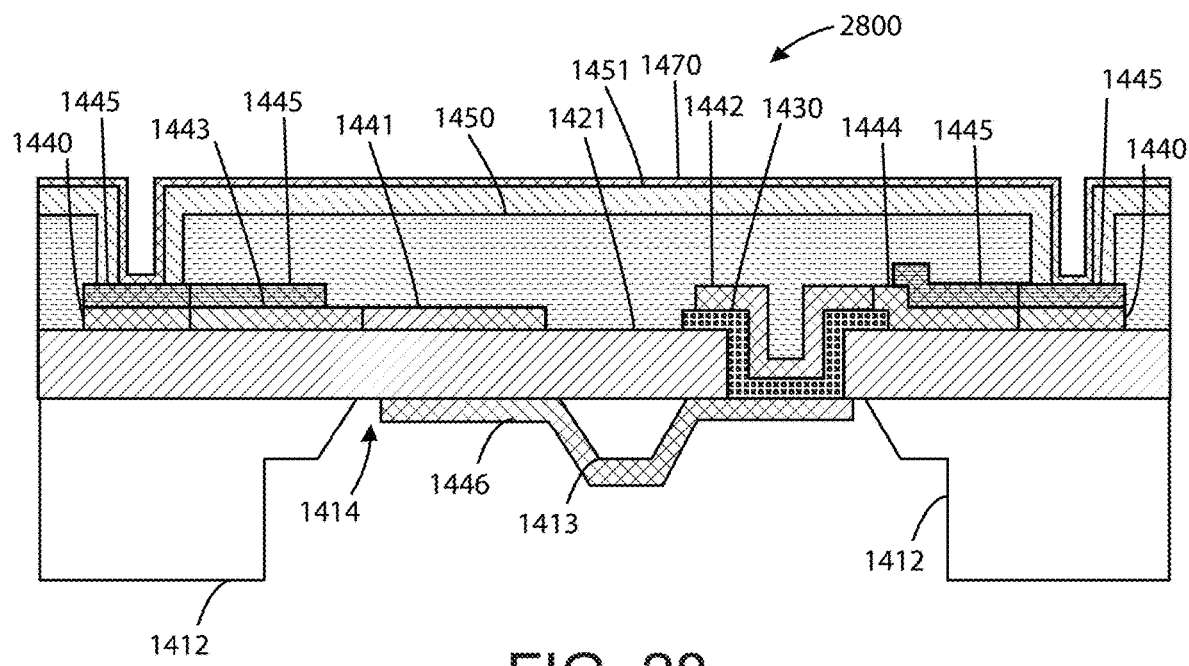

As shown, the method includes forming an under metal material 1470 overlying the repassivation material, as shown in FIG. 28. In an example, the under metal material 1470 can be sputter deposited or Under-Bump-Metal (UBM) Ti—Cu (100 Å/2000 Å). In an example, the method covers the first region and the second region such that the first electrode member 1441 and the second electrode member 1442 are each in electrical and physical contact with the under metal material 1470.

Figure 29:
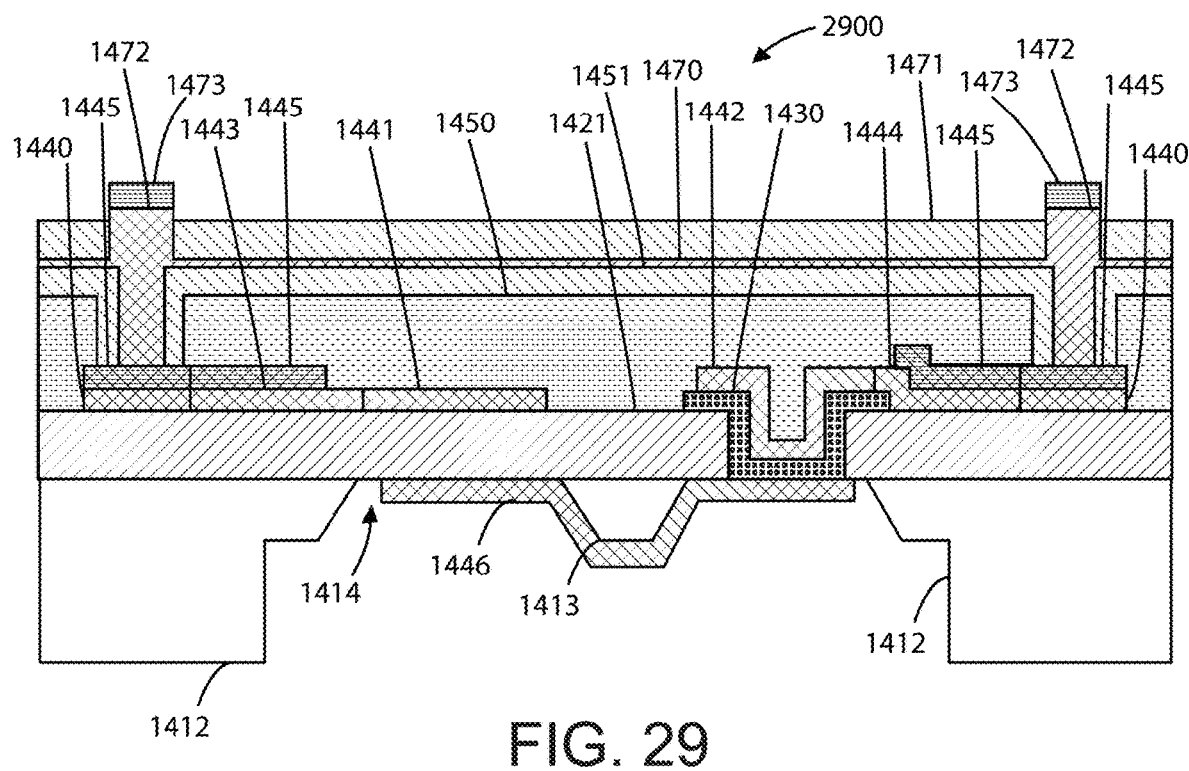

In an example, the method includes forming a thickness of resist material 1471 overlying the under metal material 1470 to cause a substantially planarized surface region, as shown in FIG. 29. In an example, the method includes applying a negative resist mask layer 1471. In an example, the method includes developing and cleaning. That is, the method forms a thickness of resist material ranging from 2 um to 10 um, and preferably about 5 um.

In an example, the method includes patterning the substantially planarized surface region of the thickness of resist material to expose a first region corresponding to the first electrode member and a second region corresponding to the second electrode member. In an example, the method includes exposing the resist material using either a UV-radiation stepper or contact aligner to expose the resist material. The resist in first region and the second region is developed using AZ 326 MIF chemical.

In an example, the method includes filling the first region and the second region using a deposition process to form a first copper pillar structure 1472 overlying the first electrode member 1441 and a second copper pillar structure 1472 overlying the second electrode member 1442.

In an example, the method includes forming a solder material 1473 overlying the first copper pillar structure 1472 and the second copper pillar structure 1472.

Figure 30:
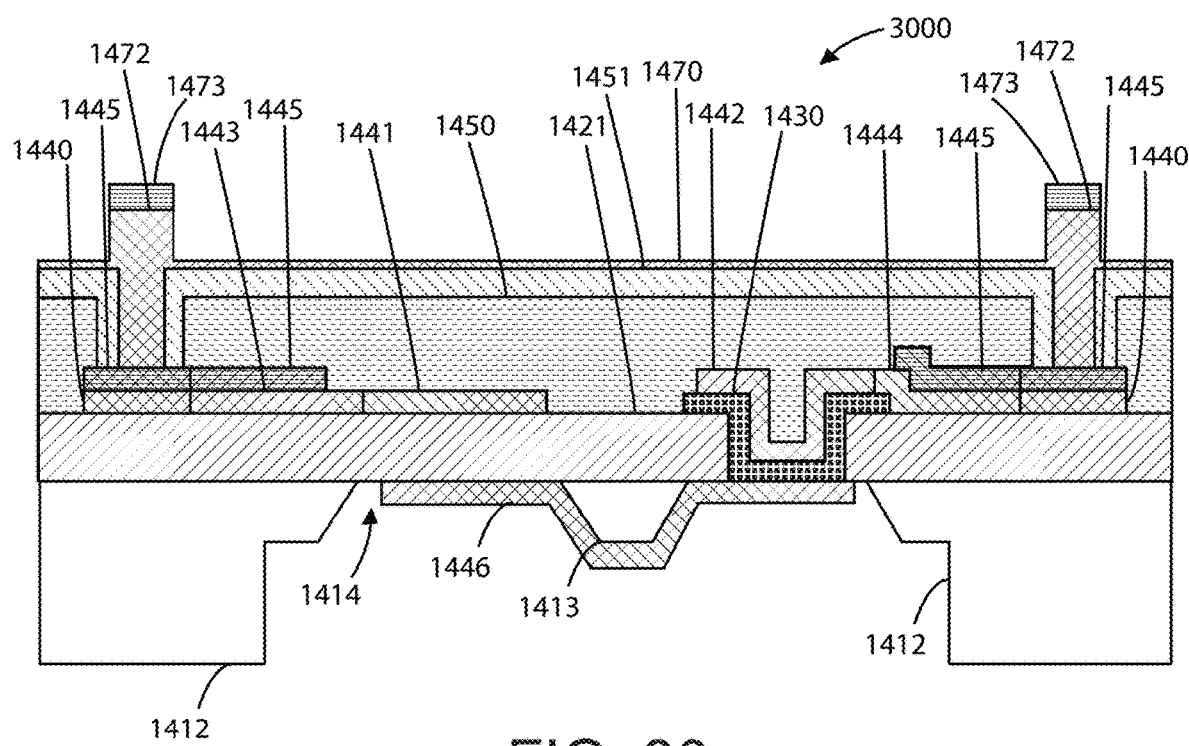

In an example, the method processes the thickness of resist material 1471 to substantially remove the thickness of resist material 1471 and expose the under metal material 1451, as shown in FIG. 30.

Figure 31:
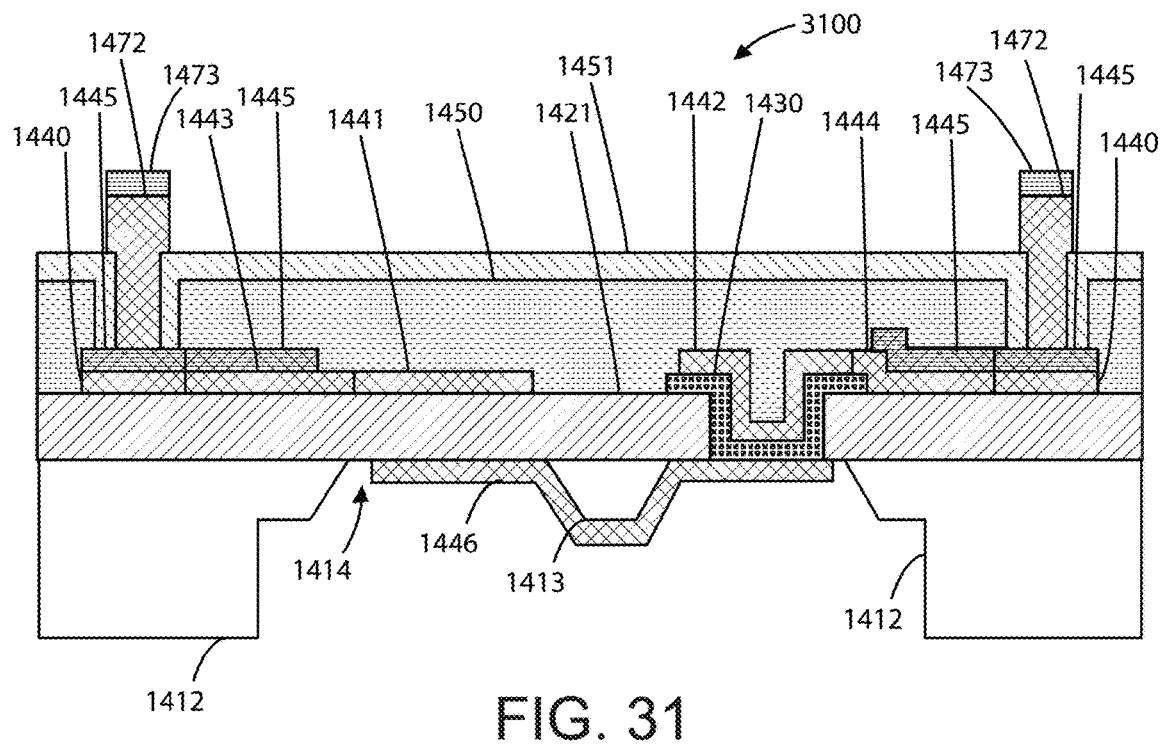

In an example, the method removes any exposed portions of the under metal material 1470, as shown in FIG. 31.

Figure 32:
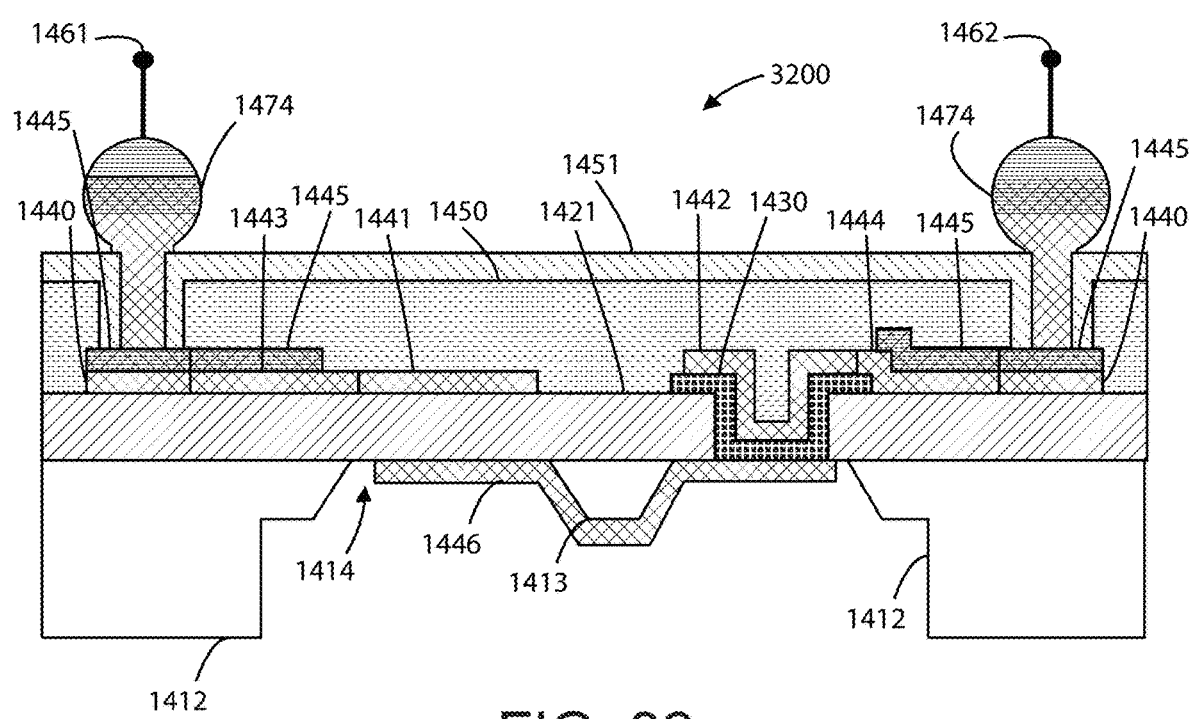

In an example, the method subjects the solder material on the first copper pillar structure 1472 and the second copper pillar structure 1472 to cause formation of a first solder bump structure 1474 overlying the first copper pillar structure 1472 and a second solder bump structure 1474 overlying the second copper pillar structure 1472 for at least each of $R_1$ and $R_N$. The process is shown in FIG. 32.

As shown, the copper and tin is deposited using a plating process. The thickness ranges from 20 um to 100 um, while the target thickness of copper is 50 um and 20 um for tin. In an example, the bumps are characterized by a pitch between bumps ranging from 50 um to 500 um, and preferably at 175 um, although there are variations.

Figure 33:
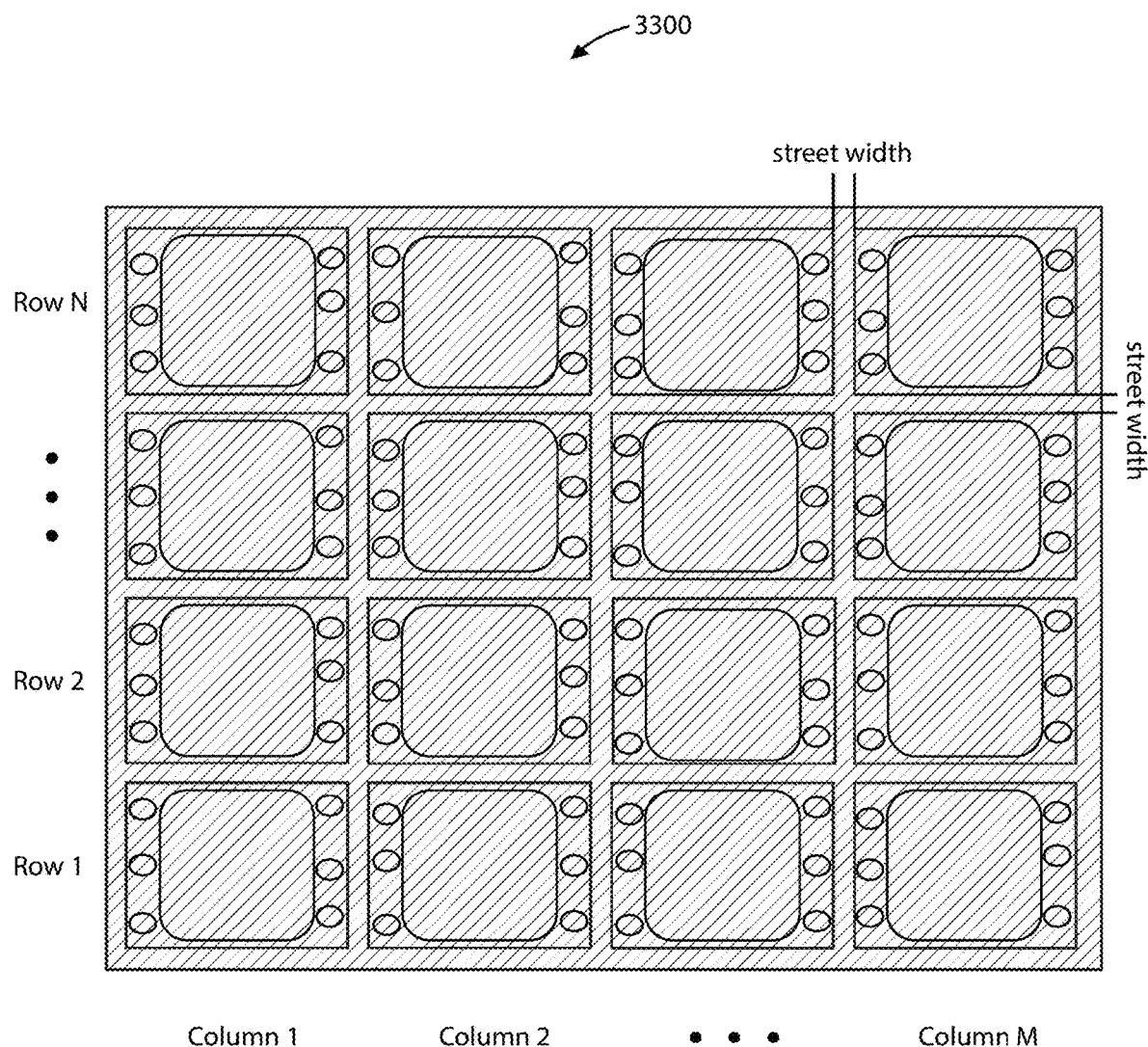
FIG. 33 is a top view diagram of a bumped wafer to be singulated or processed according to an embodiment of the present invention.

FIG. 33 is a top view diagram of a bumped wafer 3300 to be singulated or processed. In an example, the method then separates and/or unmounts the completed substrate for transfer into a wafer or die carrier. The completed substrate has the devices, and overlying protection materials. In an example, the substrate is now ready for saw and break, and other backend processes such as wafer level packaging, or other techniques. Of course, there can be other variations, modifications, and alternatives.

In an example, the processed wafer is sawed to singulate each of the chips or each resonator/filter. In an example, the wafer is mounted on blue tape, such as Blue Adhesive Plastic Film (PVC) manufactured by Nitto or Minitron. In an example, a dimension between each die is called the street width ranging from 20 um to 100 um and having a target is 80 um. In an example, the wafer has an M×N array of devices. In an example, a saw (or laser) makes N+1 cuts along all the rows in the array, then makes M+1 cuts on each and all of the columns in the array. In an example, after the cuts are complete, the blue tape is stretched onto a large round ring to separate the devices/circuits for picking operation. Of course, there can be variations.

Figure 34A:
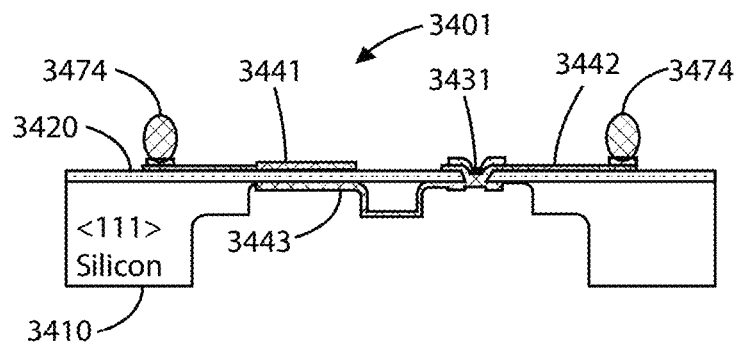
FIGS. 34A to 34C illustrate a side-view, top-view, and bottom-view diagrams of a resonator device according to an embodiment of the present invention.
Figure 34B:
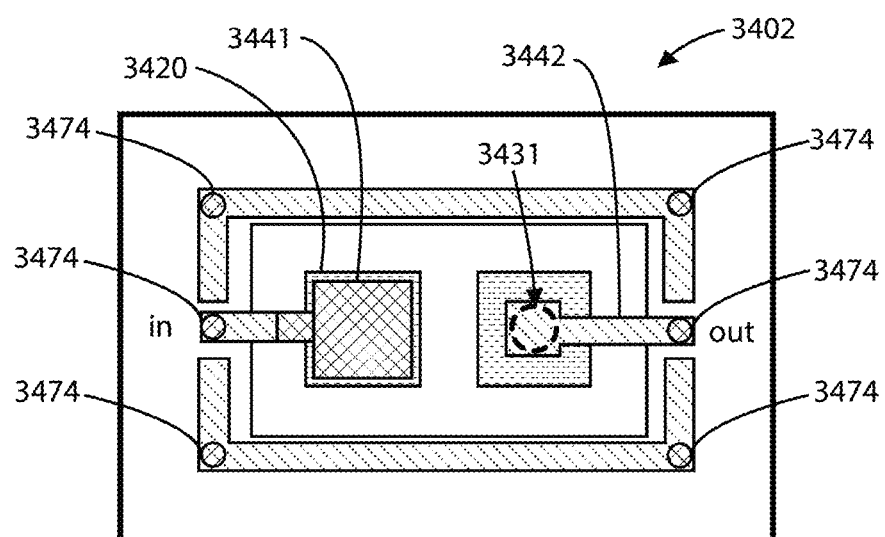
Figure 34C:
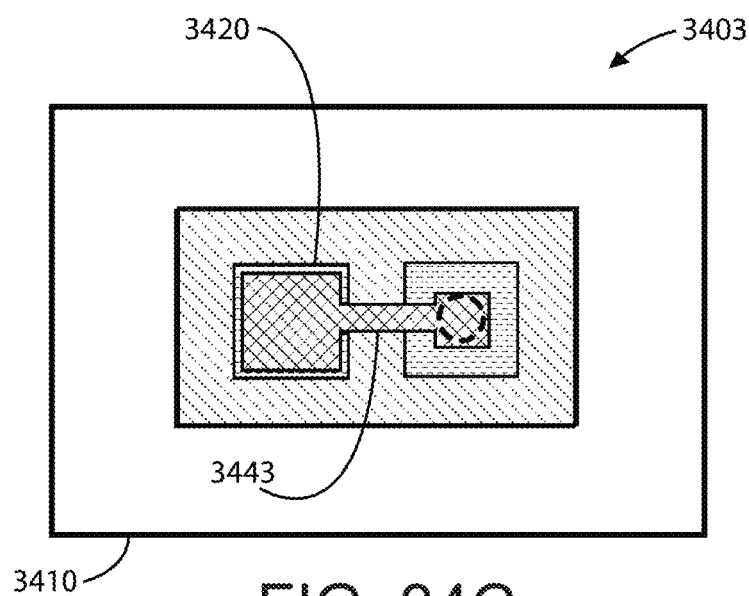

FIGS. 34A to 34C illustrate a side-view, top-view, and bottom view diagrams of the subject resonator device in an example. FIG. 34A shows the side view 3401 of a resonator device. As shown, the device has substrate 3410 with an epitaxial layer 3420 formed overlying, which can be a single crystal Group III-Nitride piezo layer. The device also includes an interconnect or via structure 3431, first and second electrode member 3441, 3442, a backside electrode member 3443, and copper pillar structures 3474. FIG. 34B shows the top view 3402 of the same resonator device with six copper pillar structures 3474 configured near an input region and an output region. FIG. 34C shows the back side view 3403, which shows the backside electrode 3443 and the piezo layer 3420. Of course, there can be other variations, modifications, and alternatives.

Figure 35:
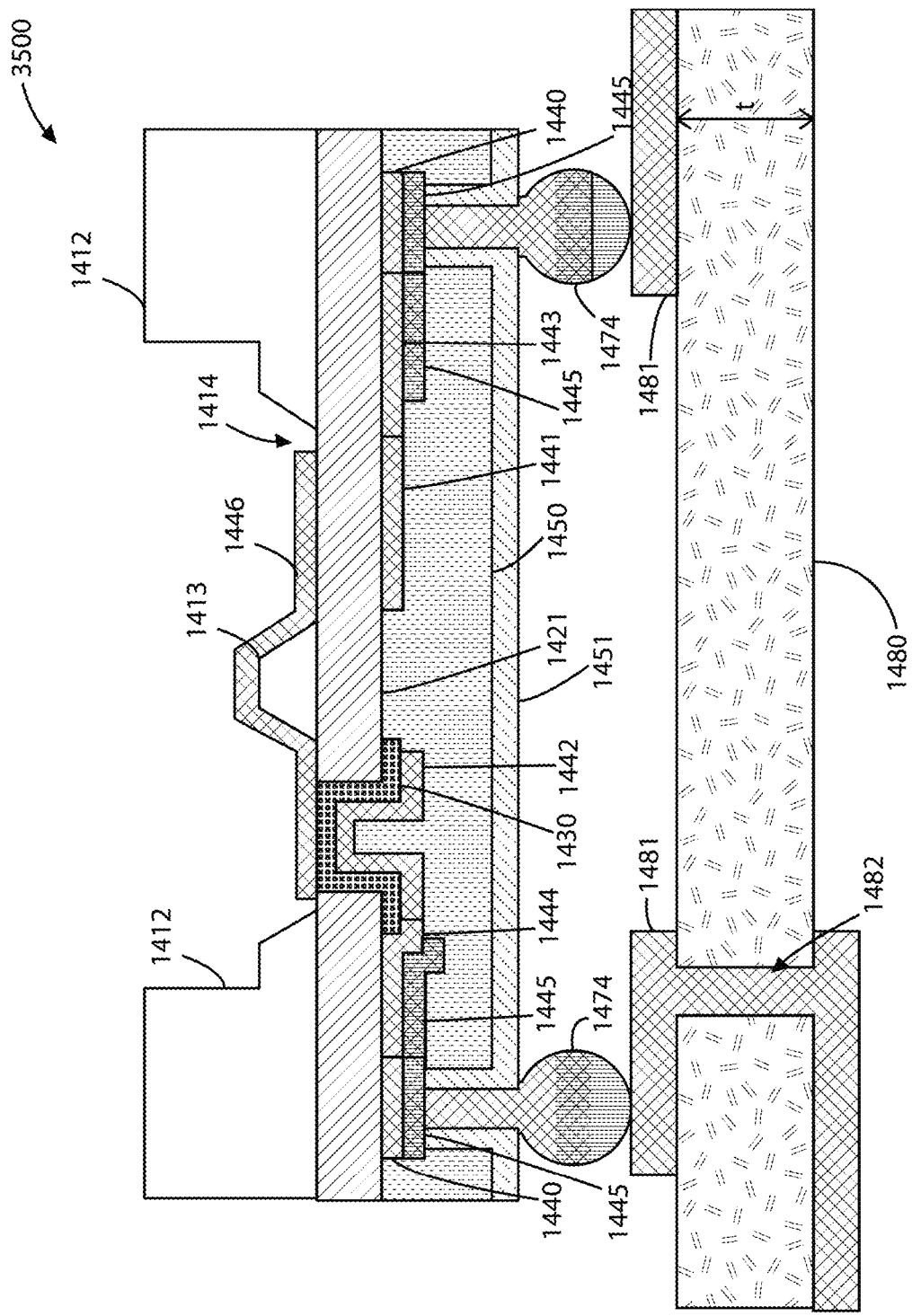
FIGS. 35 and 36 illustrate an example of mounting a resonator device on a laminate structure and a molding process according to an embodiment of the present invention.
Figure 36:
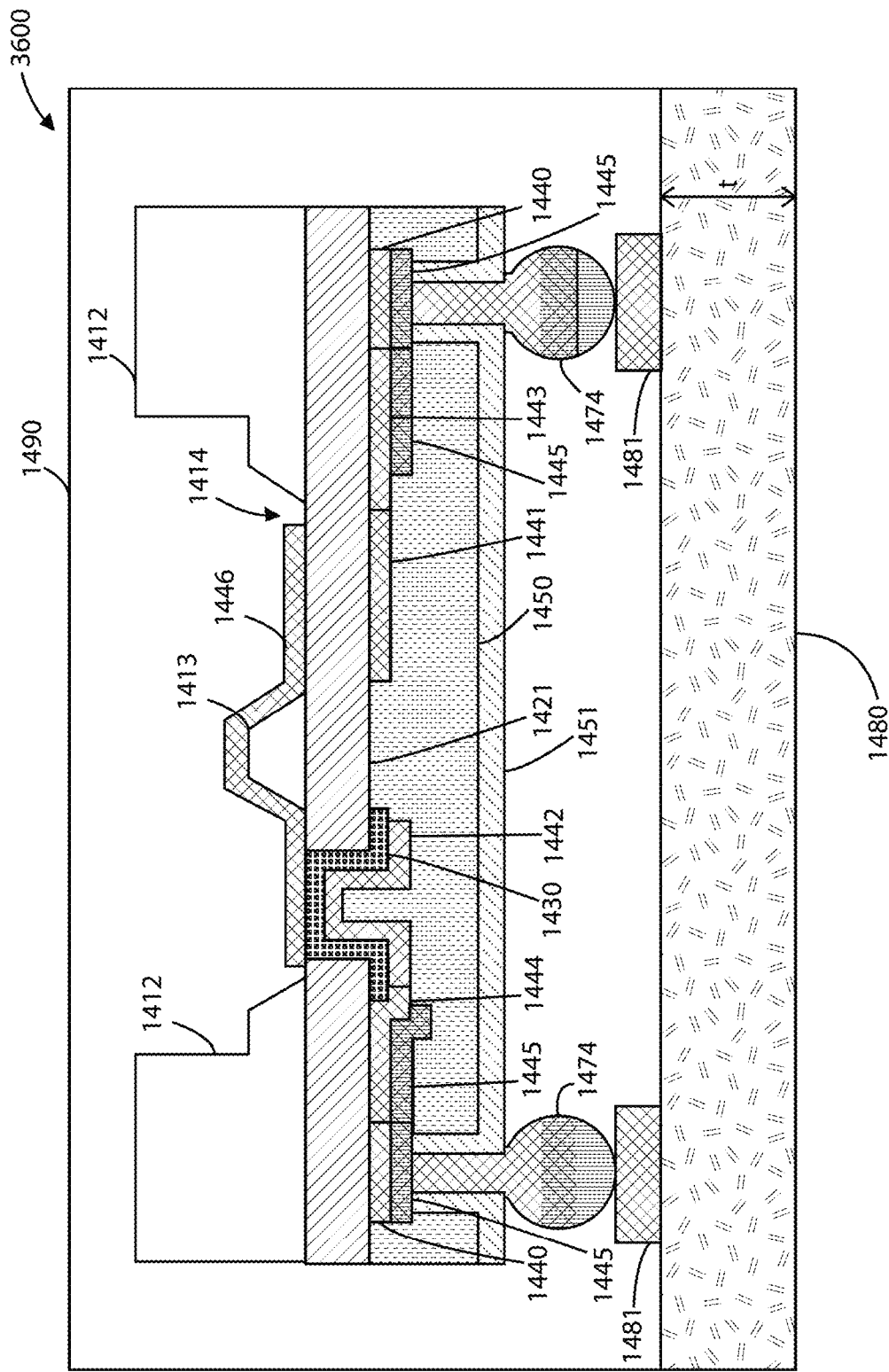

FIGS. 35 and 36 illustrate an example of mounting the device on a laminate structure 1480, and a molding process. These example shows a bumped single crystal acoustic resonator flip mounted onto a laminate board 1480 with properties characterized by a thickness, dielectric constant. Examples of such laminate materials include CX-50, MS46L and, of course, others. The laminate material has traces 1481, which can connect between one or more planes in the laminate by a via structure 1482 or the like. The traces 1481 are comprised of metal (e.g. copper) with plating material such as tin, gold, aluminum, and, of course, others. The traces 1481 on the laminate approximately 25 um thick, but can range from 10 um to 100 um. The single crystal acoustic resonator is attached to laminate using a combination of temperature and applied force. As shown in FIG. 36, the single crystal acoustic resonator can be exposed or encapsulated 1490 in plastic prior to mounting on laminate. The mounted embodiment can either be a single resonator or a filter circuit (consisting or more than one resonator).

FIGS. 37 to 54 illustrate a method of manufacturing a resonator device on a transparent substrate in an example. This illustration is merely an example, and should not unduly limit the scope of the claims herein.

As shown, the method can be outlined as follows:
1. Start;
2. Provide a single crystal acoustic resonator device formed on a silicon substrate having a first thickness. In an example, the single crystal acoustic resonator device comprises a resonator structure and a contact structure;
3. Form a patterned solder structure configured overlying the single crystal acoustic resonator device and the surface region to form a first air gap region provided from the patterned solder structure and configured between the resonator structure and a first portion of the mounting structure, wherein the first air gap structure having a height of 10 microns to 50 microns, the patterned solder structure having a patterned upper surface region;
4. Form a thickness of an epoxy material overlying the patterned upper surface region, while maintaining the resonator structure free from any of the epoxy material;
5. Position a mounting substrate member to the epoxy material;
6. Cure the epoxy material to mate the single crystal acoustic resonator device to the mounting substrate member. In an example, the mounting substrate member is optically transparent, the mounting substrate member comprising a surface region;
7. Process the silicon substrate to remove a portion of the silicon substrate to form a resulting silicon substrate of a second thickness, the second thickness being less than the first thickness, the resulting silicon substrate having a silicon backside region.

8. Perform other steps, as desired.

The aforementioned steps are provided for the formation of a packaged resonator device including a single crystal capacitor dielectric. Of course, depending upon the embodiment, steps or a step can be added, removed, combined, reordered, or replaced, or has other variations, alternatives, and modifications. Further details of the present manufacturing process can be found throughout the present specification, and more particularly below.

Referring to FIGS. 37-40, the method includes providing a single crystal acoustic resonator device 3720 formed on a silicon substrate 3710 having a first thickness, as shown in FIG. 37. In an example, the substrate has a single crystal piezo material, such as GaN, AlGaN, or AlN. The material has a thickness ranging from 4 um to 7 um, although there may be variations. In an example, a 2 um piezo is optimal thickness for 2 GHz. In an example, the substrate can be silicon, sapphire, SiC, among others. In an example, the piezo material is configured c-axis up orientation to achieve polarization field.

In an example, the single crystal acoustic resonator device comprises a resonator structure and a contact structure. As shown in FIG. 38, the substrate 3710 is a silicon substrate, an overlying single crystal piezo material 3720, and an electrode member or backside electrode 3746. In an example, the electrode can be Mo, Ta or other refractory metal, typical thickness is 300 nm, with a range of 30 nm to 4000 nm, although there can be variations.

In an example, the method includes a mask and etch topside trench to remove piezo material 3720, as shown in FIG. 39. In an example, the etch process can include a reactive ion etch process using BCl3, Ar gas, SF6 or others. In an example, the process uses a PlasmaTherm model 770 ICP-RIE operated at 7 mT, 20 sccm Cl2, 8 sccm of BCl3, 5 sccm of Ar at 400 W ICP and 25 W RIE. Of course, there can be variations.

In an example, the method deposits a "Backside" plug metal 3747, as shown. The plug metal can include Ti/Al (100 Å/2 um), among others. In an example, the metal serves as a "catch pad" for backside contact.

Figure 41:
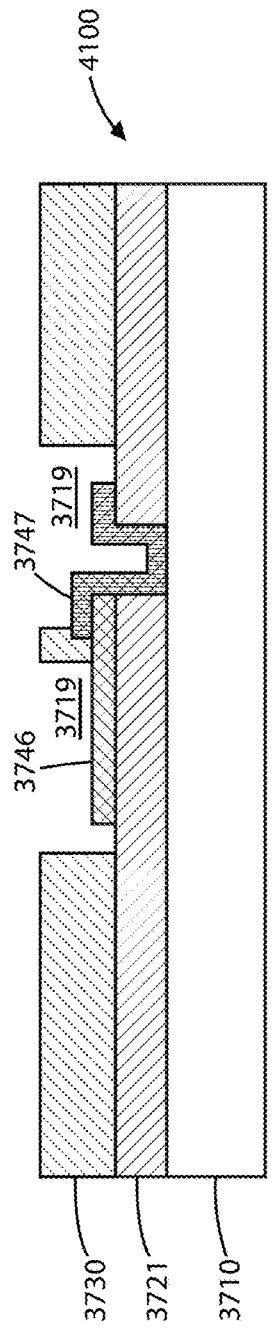

Referring to FIG. 41, the method forms a patterned solder material structure or solder dam mask 3730 configured overlying the single crystal acoustic resonator device and the surface region to form a first air gap region 3719 provided from the patterned solder structure 3730 and configured between the resonator structure and a first portion of the mounting structure or mounting substrate member, wherein the first air gap structure or region 3719 having a height of 10 microns to 50 microns. In a specific example, the height is about 25 um, where the height is a measure from a first perimeter region to a second perimeter region of the first air gap region 3719. In an example, the patterned solder structure has a patterned upper surface region.

Figure 42:
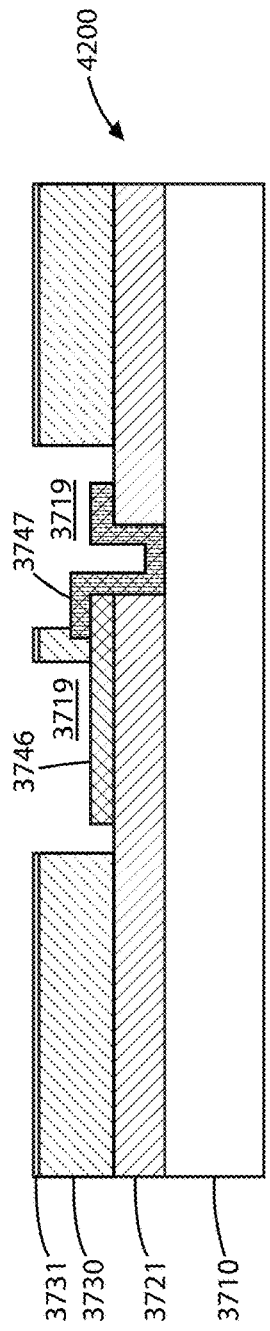

In an example, the method forms a thickness of an epoxy material 3731 overlying the patterned upper surface region, while maintaining the resonator structure free from any of the epoxy material, as shown in FIG. 42. In a specific example, the epoxy material is a two-stage epoxy.

Figure 43:
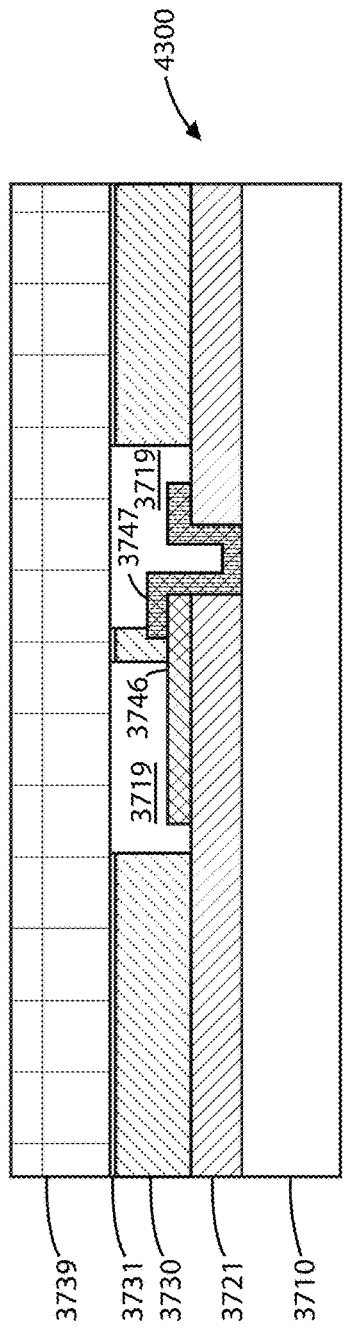

Referring now to FIG. 43, the method positions a mounting substrate member 3739 to the epoxy material. In an example, the method cures the epoxy material 3731 to mate the single crystal acoustic resonator device to the mounting substrate member 3739. In an example, the mounting substrate member 3739 is optically transparent. In an example, the mounting substrate member 3739 comprises a surface region. Further, in an example, the mounting substrate 3739 comprises of BF33 or BK7 glass material, and is selected to match temperature coefficient of expansion with the silicon substrate member.

In an example referring to FIG. 44, the method processes the silicon substrate to remove a portion of the silicon substrate to form a resulting silicon substrate 3711 of a second thickness, the second thickness being less than the first thickness. In an example, the resulting silicon substrate 3711 has a silicon backside region.

In an example, the method performs a backside via and capacitor etch of the substrate 3712. The etch exposes a portion of the landing pad 3747 and backside of piezo membrane 3721, as shown in FIG. 45. In an example, the etch can use a SF6 gas enables selective RIE process. Of course, there can be other variations, modifications, and alternatives.

Figure 47:
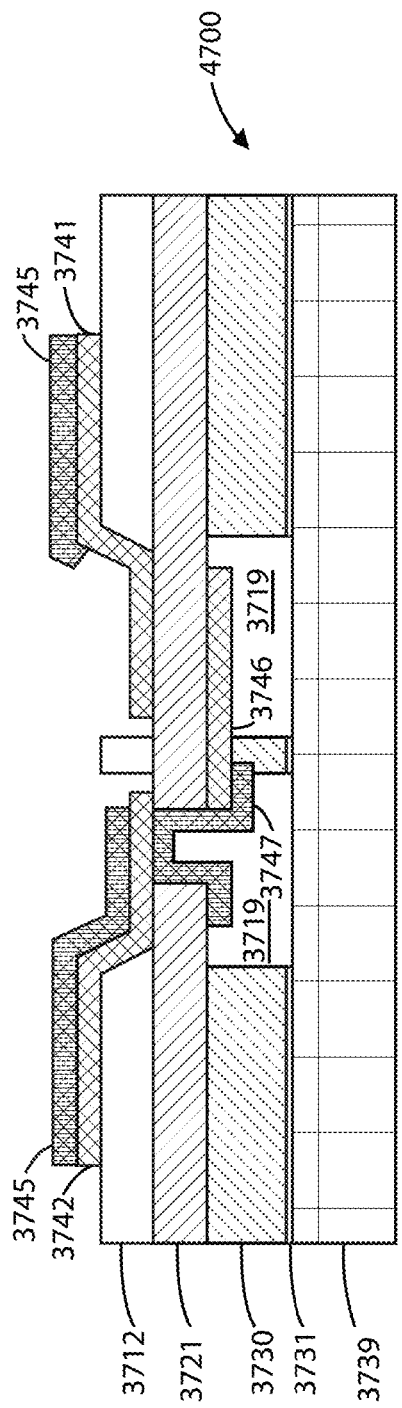
Figure 48:
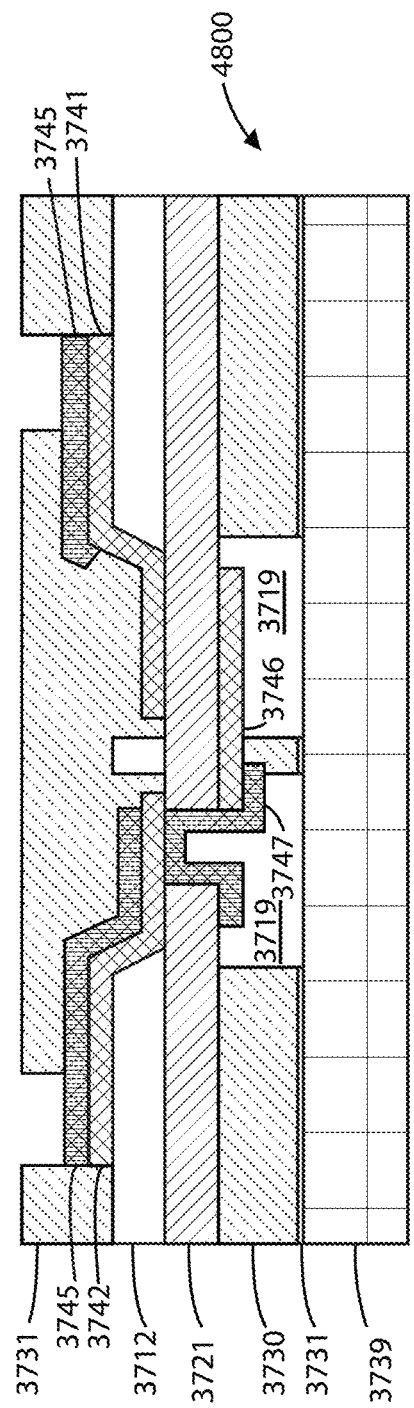

Referring to FIGS. 46-48, the method forms metallization overlying the thinned substrate member, which can include a first electrode 3741 and second electrode 3742. In an example, the method performs a topside capacitor plate (with the first electrode 3741) and connect landing pad to topside plane (with the second electrode 3742) deposition process. In an example, the plate and pad are made of a suitable material such as Mo, Ta or other refractory metal, among combinations thereof. In an example, the thickness of such layer ranges from 1000 Å to 10,000 Å, while 3000 Å is target thickness, although there can be variations. In an example, the layer has a titanium (Ti) cap metal may be used to prevent oxidation of refractory metal.

In an example, the method can also form via deposition a topside overlay metal material 3745, as shown in FIG. 47. In an example, the metal has a sufficient thickness for to act as a pad for probing and has low resistance for a high quality interconnect. In an example, the interconnect has Ti/Al (100 Å/2 um) as a target thickness, although there can be thicknesses of 0.5 um to 5 um. In an example, the method also provides formation of a solder dam mask 3731 or other fill material, which is patterned, as shown in FIG. 48. The material is configured to protect the surface region from scratches, and has a thickness of 1 um to 50 um and a target thickness of 5 um, while there can be variations.

Figure 49:
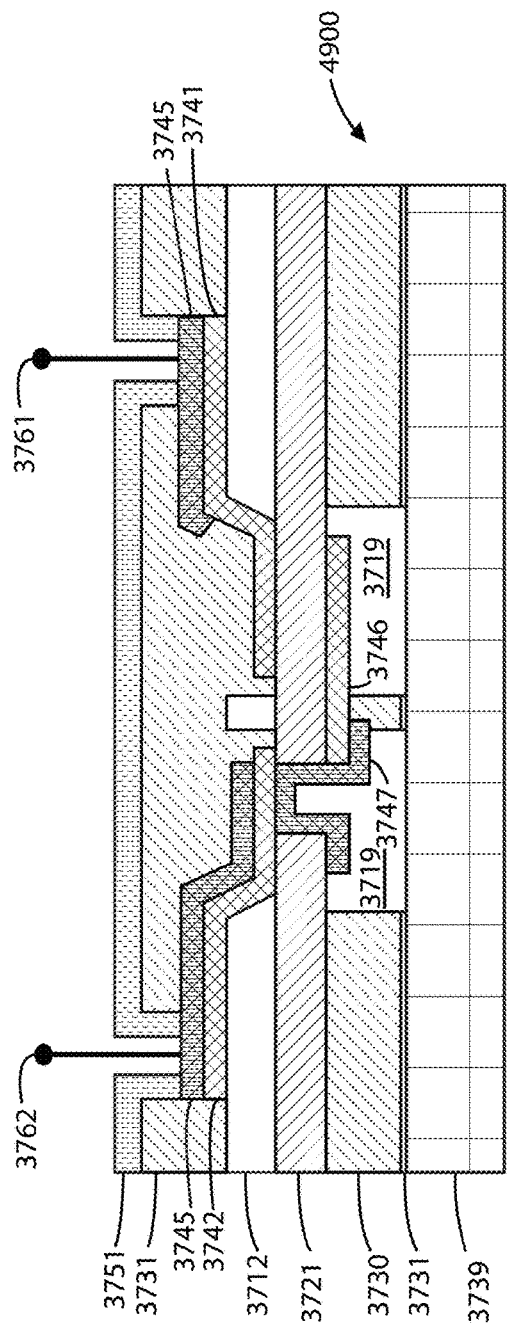

Referring now to FIGS. 49-54, the method performs a bump process. In an example, the method includes forming a repassivation material 3751 overlying the solder dam mask material, as shown in FIG. 49. In an example, the repassivation material has a first region exposing the first electrode member 3761 and a second region exposing the second electrode member 3761.

Figure 50:
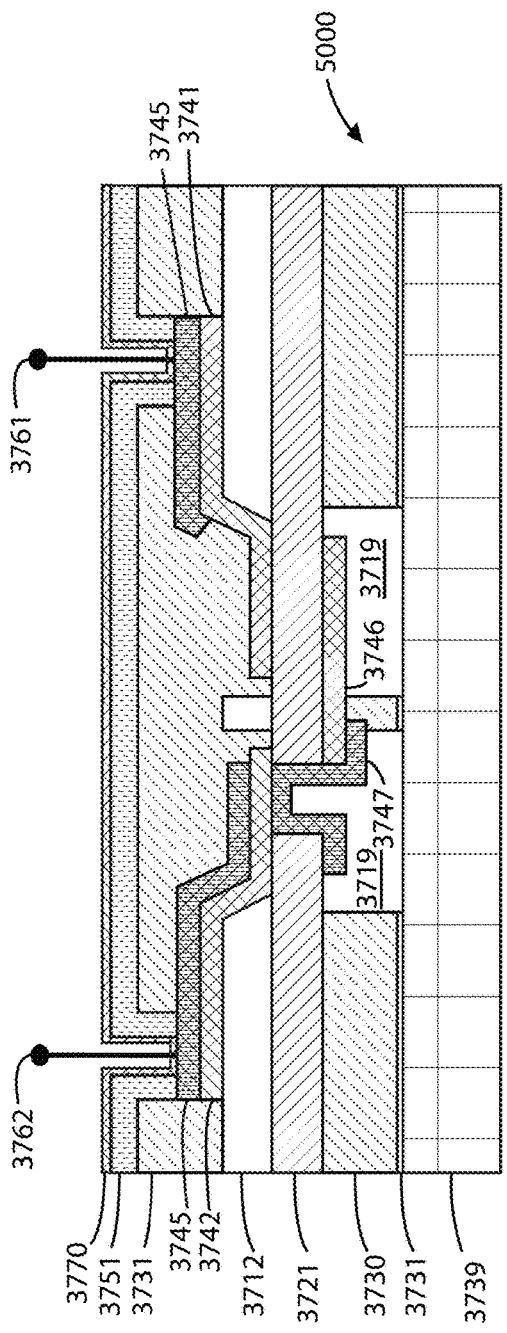

In an example, the method includes forming an under metal material 3770 overlying the repassivation material and covering the first region and the second region such that the first electrode member and the second electrode member are each in electrical and physical contact with the under metal material. This is shown in FIG. 50. In an example, the metal material can be a Ti/Cu seed material, among others.

Figure 51:
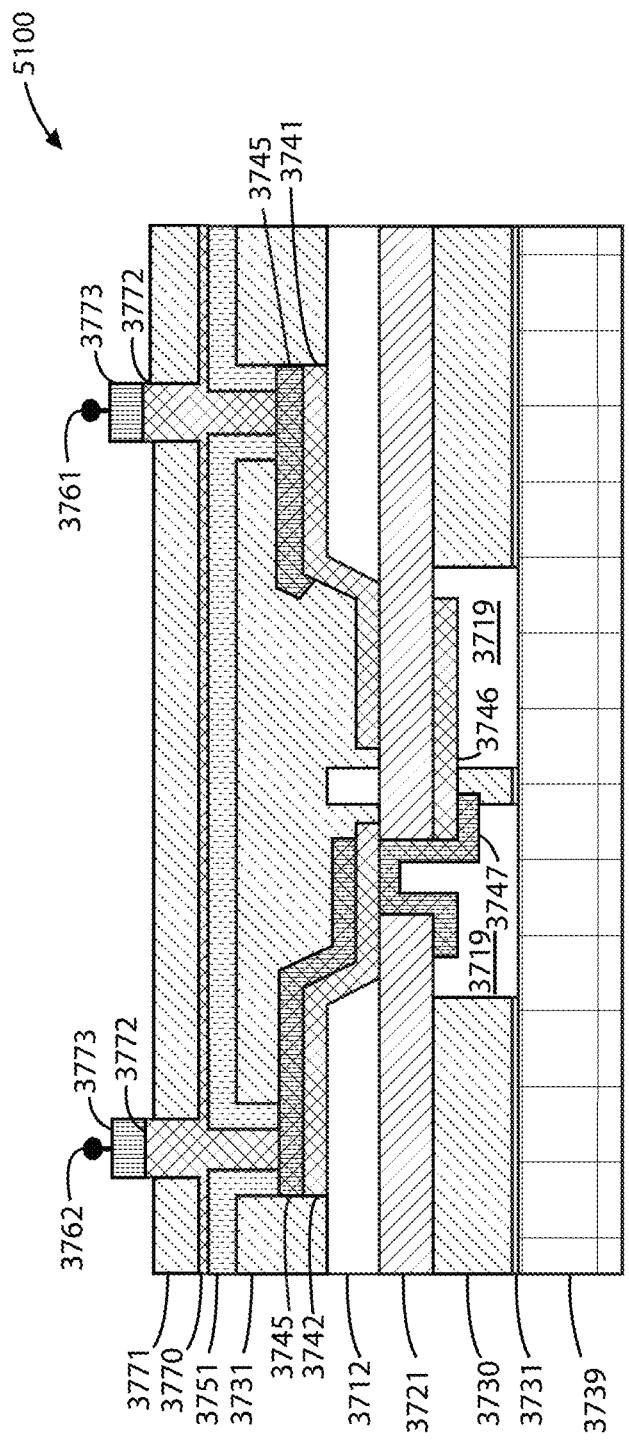

In an example, the method includes forming a thickness of resist material 3771 overlying the under metal material 3770 to cause a substantially planarized surface region, as shown in FIG. 51. The resist material 3771 is developed and surface cleaned.

In an example, the method includes patterning the substantially planarized surface region of the thickness of resist material 3771 to expose a first region corresponding to the first electrode member 3761 and a second region corresponding to the second electrode member 3762. In an example, the method includes filling the first region and the second region using a deposition process to form a first copper pillar structure 3772 overlying the first electrode member and a second copper pillar structure 3772 overlying the second electrode member.

Figure 52:
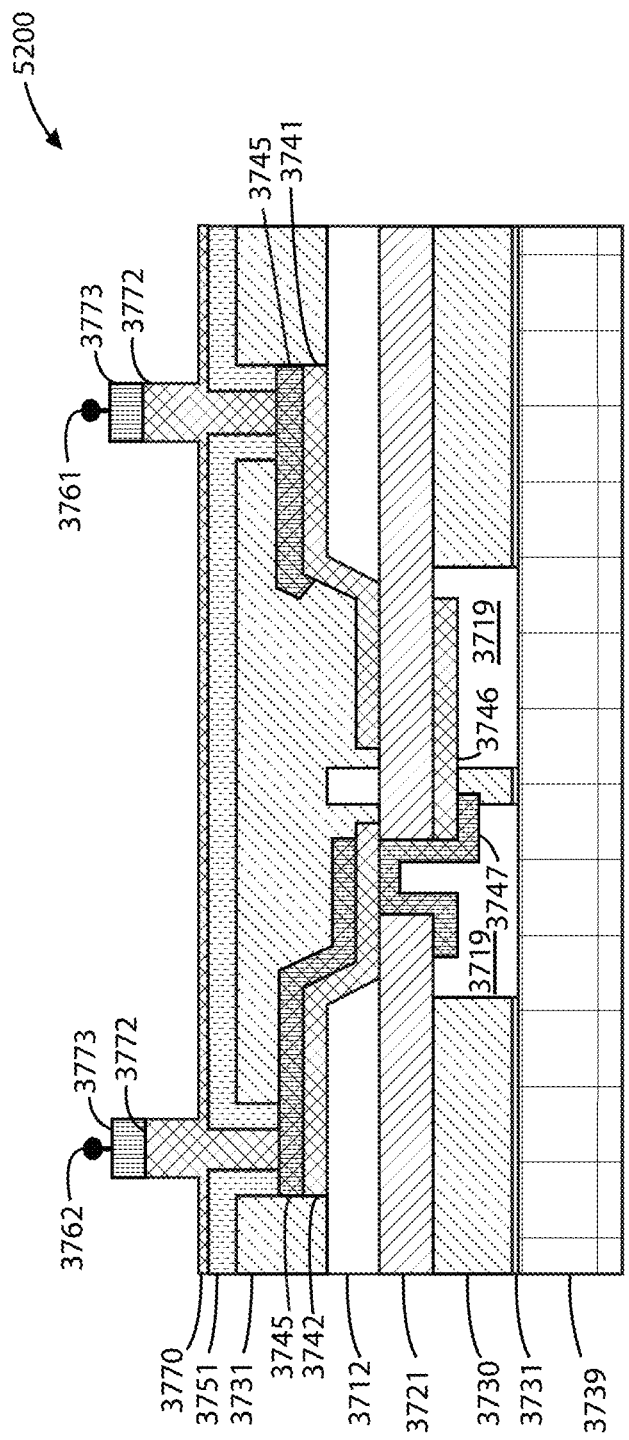

In an example, the method includes forming a solder material 3773 overlying the first copper pillar structure 3772 and the second copper pillar structure 3772. The method also processes the thickness of resist material 3771 to substantially remove the thickness of resist material 3771 and expose the under metal material 3770, as shown in FIG. 52.

Figure 53:
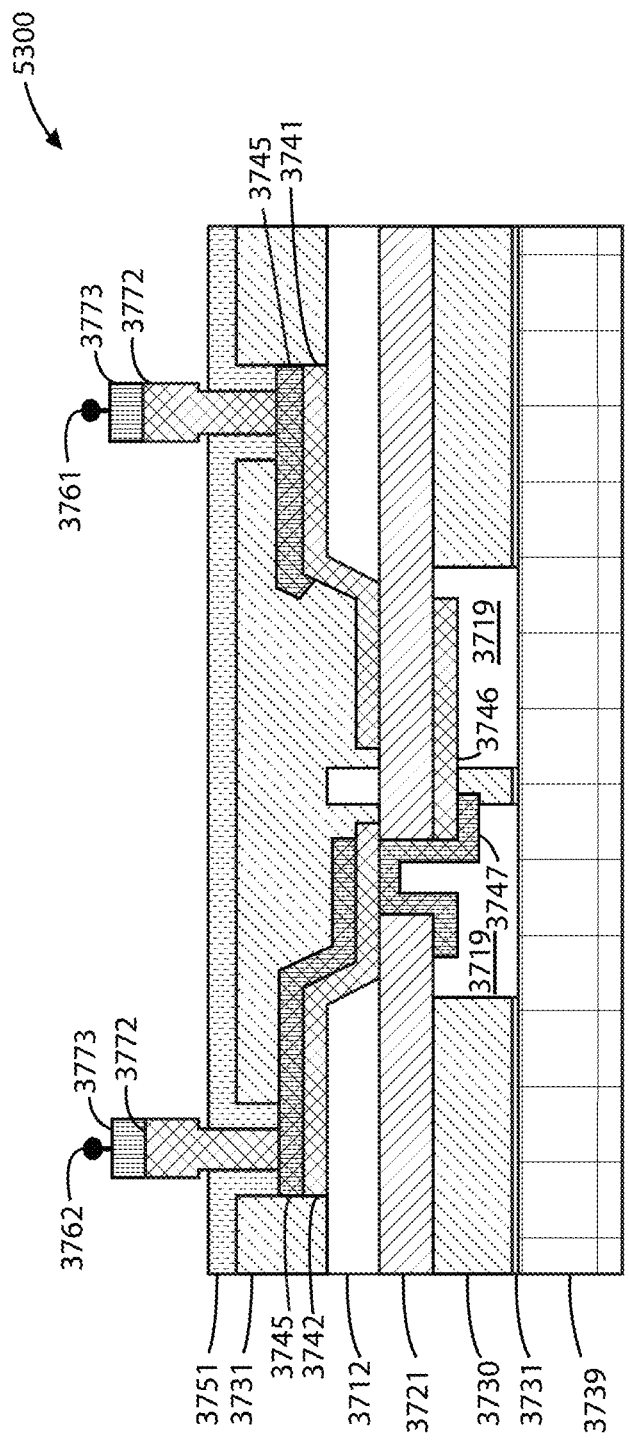
Figure 54:
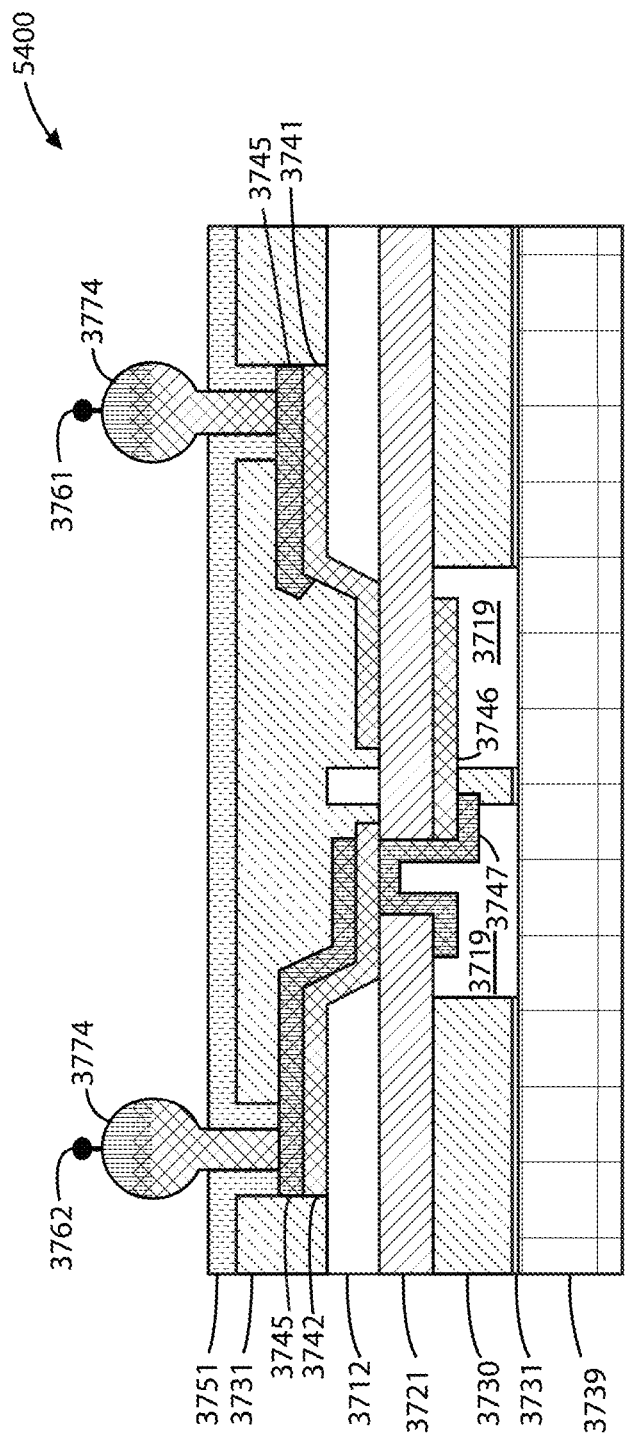

In an example, the method also removes any exposed portions of the under metal material 3770, as shown in FIG. 53. The method subjects the solder material on the first copper pillar structure and the second copper pillar structure to cause formation of a first solder bump structure 3774 overlying the first copper pillar structure and a second solder bump structure 3774 overlying the second copper pillar structure. This is shown in FIG. 54. Further details of various resonator device structures can be found throughout the present specification, and more particularly below.

Figure 55A:
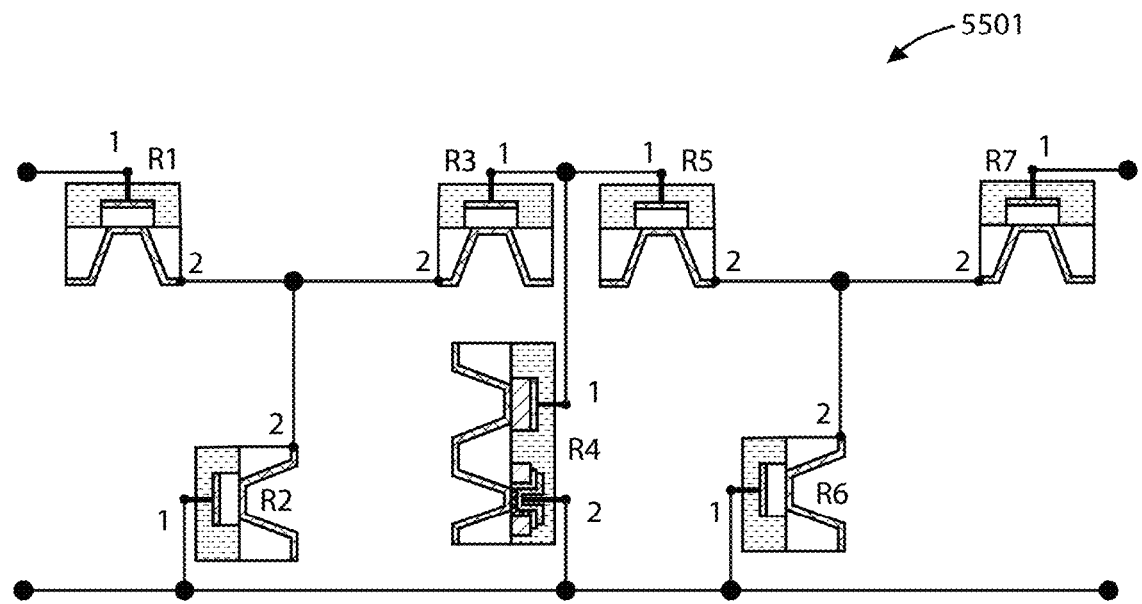
FIGS. 55A and 55B illustrate a plurality of resonator devices according to an embodiment of the present invention.
Figure 55B:
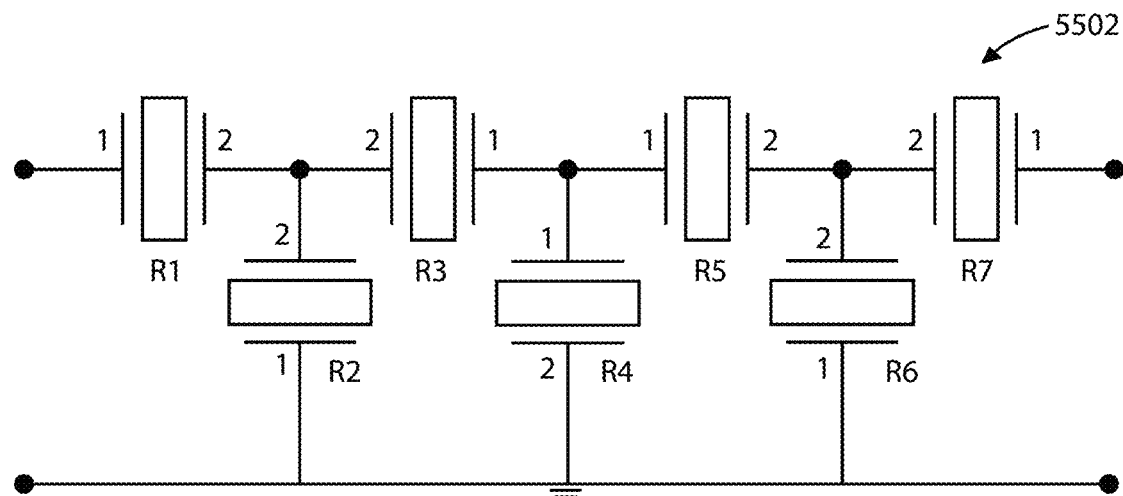

FIGS. 55A and 55B is a plurality of resonator devices in an example of the present invention. FIG. 55A shows a configuration 5501 with only 1 contact region containing a through via structure along with 7 resonators to build a seven element filter circuit. FIG. 55B shows an equivalent block diagram 5502. Referring to FIGS. 55A and 55B, the following illustration configures a filter with reduced or even minimal use of vias to save substrate area. In an example, the range of values for the present filter configuration is from seven down to one, or a single via (shown right). In an example, the present illustration uses the following boundary conditions: (1) Input of R1 and output of R7 are arranged such they are both topside node 1; (2) maximize the number of internal nodes, which use common node, and (3) the common node (bottom of R2, R4, R6) combine at the top surface of the substrate. As shown, only a single via is included, which leads to savings in expense, processing, and substrate area. Of course, there are multiple examples that can range from the single via to seven vias or more.

In an example, the second electrodes are shared on a common internal node using a backside connection and metallization. In an example, the first electrodes are shared using a top side connection, which couple each of them together. In an example, only R4 has a via structure, which couples to the lower common electrode member. Of course, there can be variations, modifications, and alternatives. In an example, the fewer vias leads to less parasitic capacitance or other loads, and reduces processes, and improves substrate usage, which are beneficial for the manufacture of highly integrated devices.

Figure 56A:
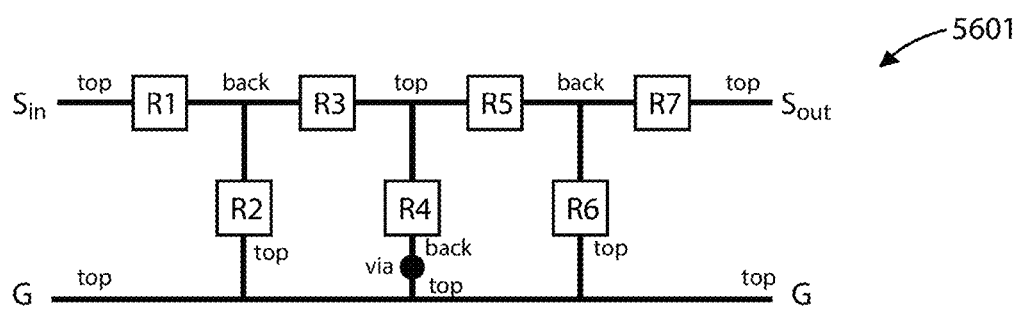
Figure 56B:
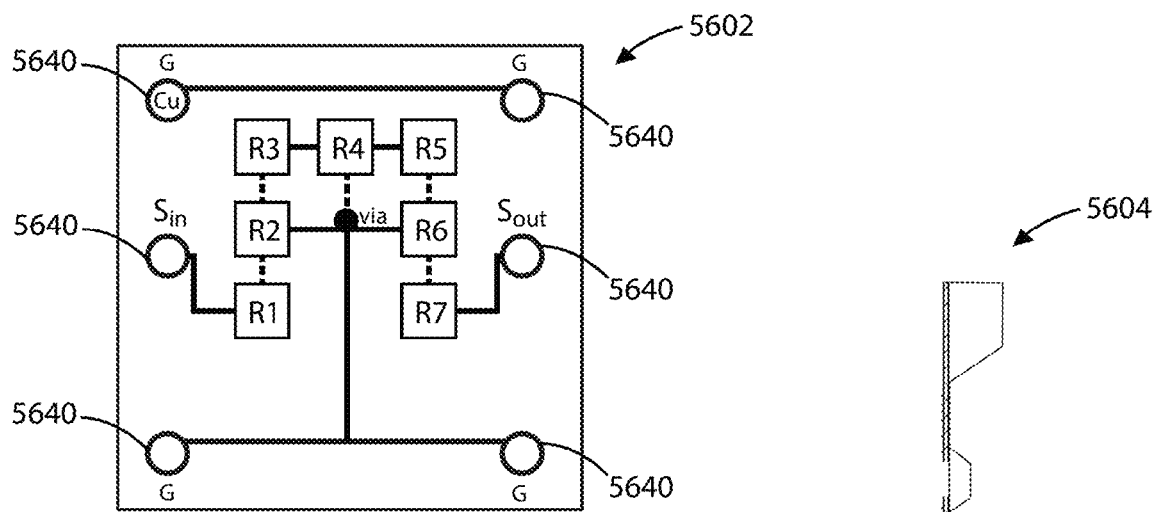
Figure 56D:
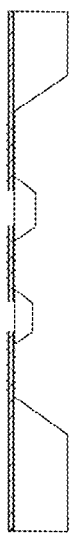
Figure 56C:
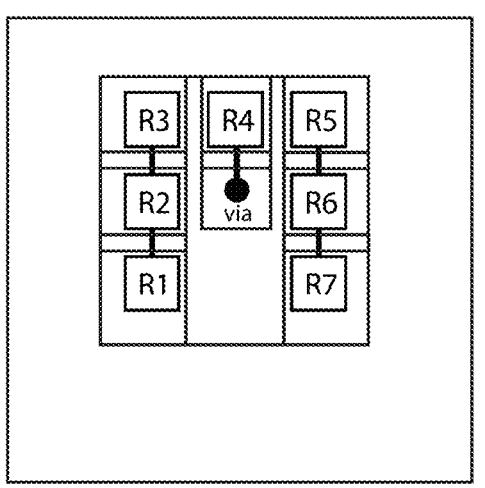

FIGS. 56A to 56D illustrate examples of resonator devices according to embodiments of the present invention. FIG. 56A shows a block configuration 5601 of seven resonator devices configured as a 7-resonator ladder BAW filter circuit. FIG. 56B shows a top view 5602 of the device with copper pillar bump structures 5640. In this embodiment, not every resonator is connected to a bump. Internal nodes within the filter circuit can be internally connected and do not require connection through solder bumps. FIG. 56C shows a back-side view 5603 of the same device and FIG. 56D shows a side view 5604 of the same device. As shown, the top view shows a pair of grounds G, G, which relate to the BAW circuit. In an example, Sin and Sout are also shown and coupled between R1, R2, R3, R4, R5, R6, and R7, where R2 and R6 coupled to each other to R4 and the via. In an example, the back-side is also shown. The side view has recessed regions and bulk regions, as shown.

Figure 57A:
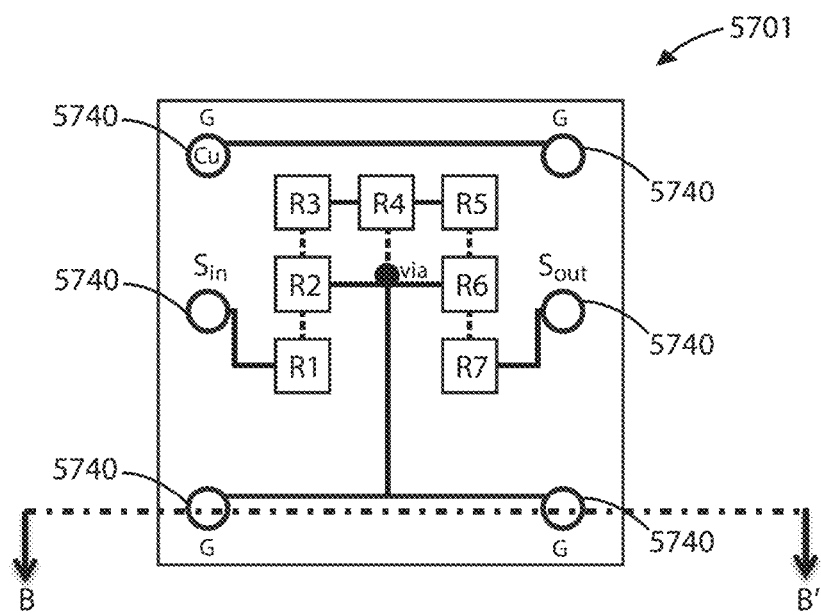
Figure 57B:
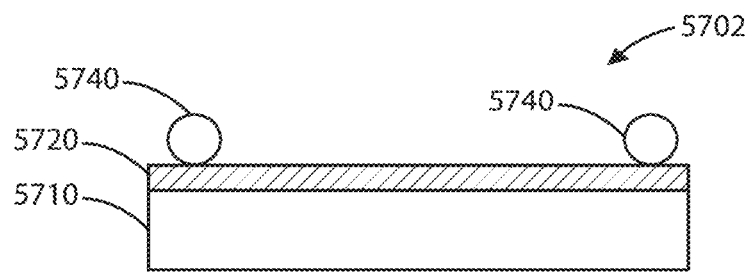

FIG. 57A shows a similar device 5701 with copper pillar bump structures 5740 as shown in FIG. 56A with a cross-sectional plane marker B-B'. FIG. 57B shows a cross-sectional view 5702 of the device across the B-B' plane. This device includes a substrate 5710, single crystal piezo layer 5720, and copper bumps 5740.

Figure 58A:
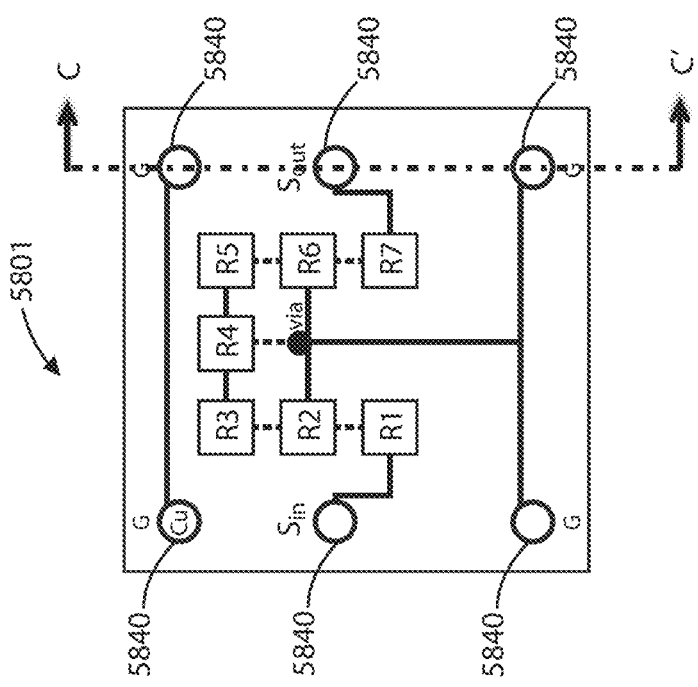
Figure 58B:
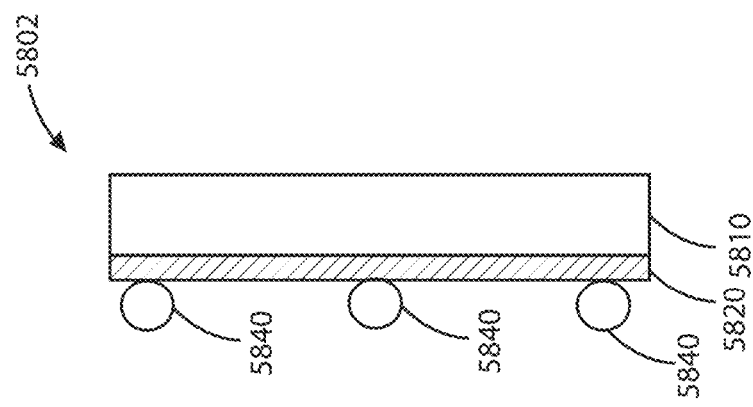

FIG. 58A shows a similar device 5801 with copper pillar bump structures 5840 as shown in FIG. 56A with a cross-sectional plane marker C-C'. FIG. 58B shows a cross-sectional view 5802 of the device across the C-C' plane. This device includes a substrate 5810, single crystal piezo layer 5820, and copper bumps 5840.

Figure 59:
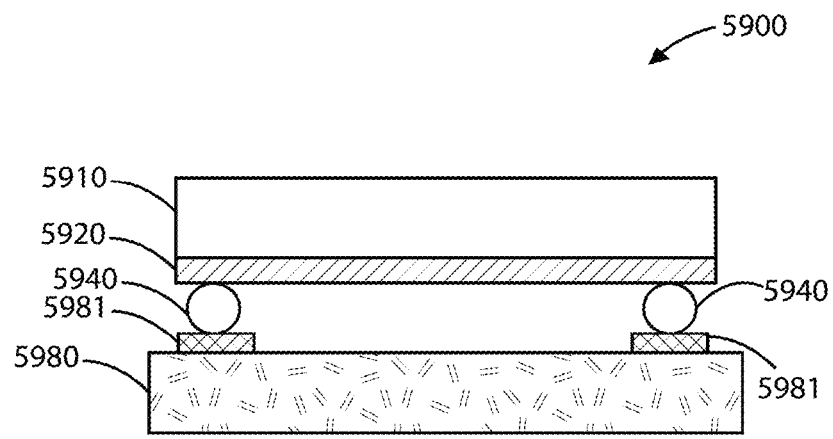
Figure 60:
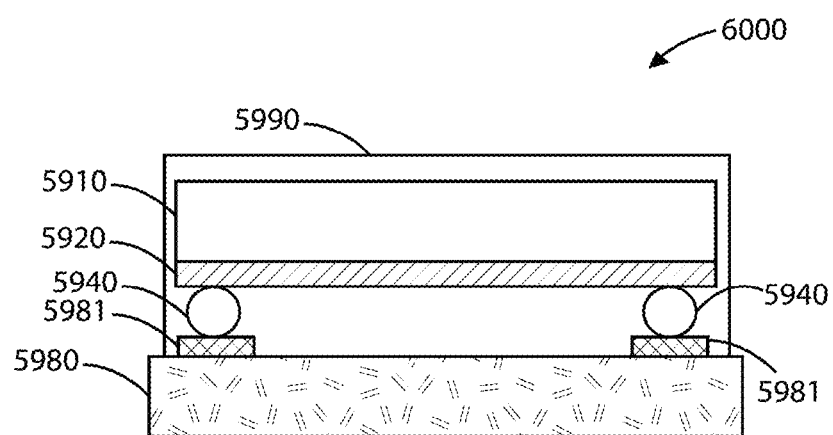

FIG. 59 illustrates a flip-chip filter on laminate (multi-chip module) according to an embodiment of the present invention. As shown, the device 5900 can include a resonator device include a piezo layer 5920 overlying a substrate 5910, which is flipped and coupled to a laminate board 5980 through copper bumps 5940 connected to metal interconnects 5981. FIG. 60 shows a similar device 6000, but the device is packaged in an encapsulation 5990.

FIGS. 61A to 61D illustrate examples of resonator devices according to embodiments of the present invention. FIG. 61A shows a block configuration 6101 of seven resonator devices configured as a 7-resonator ladder BAW filter circuit on laminate. Each of R1-R7 is flip chip single crystal acoustic resonators, which are selected to create a desired filter response. FIG. 61B shows a side view 6102 of the same device. FIG. 61C shows a top view 6103 of the same device with the copper bumps 6140. FIG. 61D shows a backside view 6104 with the vias being visible and configured with Sin and Sout.

Figure 62:
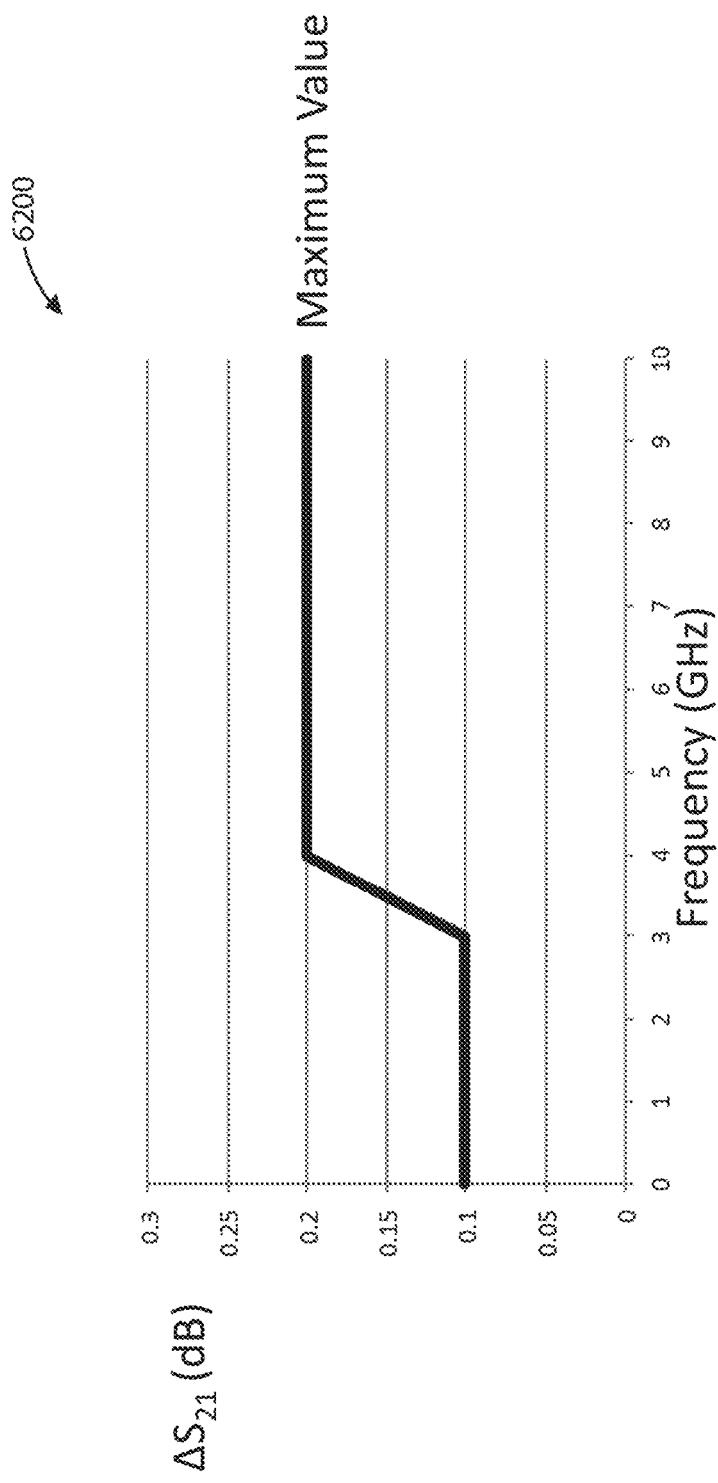
FIG. 62 is a simplified plot of insertion loss plotted against frequency according to an embodiment of the present invention.

FIG. 62 is a simplified plot 6200 of insertion loss (also referred to as S21, transmission gain, or insertion gain) plotted against frequency in an example. The plot is a characteristic loss added by encapsulating the bumped resonator (or filter circuit) with plastic material. As shown, microwave s-parameter can be measured for the flip chip resonator (device or filter circuit). In an example, delta S21 is an insertion loss of the device in flip chip configuration (open air). For a good solution the difference between S21,p and S21,fc (defined as deltaS21) is less than the plot below. Of course, there can be other examples, and alternatives.

While the above is a full description of the specific embodiments, various modifications, alternative constructions and equivalents may be used. As an example, the packaged device can include any combination of elements described above, as well as outside of the present specification. As used herein, the term "substrate" can mean the bulk substrate or can include overlying growth structures such as a gallium and nitrogen containing epitaxial region, or functional regions, combinations, and the like. Therefore, the above description and illustrations should not be taken as limiting the scope of the present invention which is defined by the appended claims.

What is claimed is:

1. A wafer scale package apparatus, the apparatus comprising:
    a mounting substrate member, the mounting substrate member being optically transparent, the mounting substrate member comprising a surface region;
    a single crystal acoustic resonator device configured overlying the surface region, the single crystal acoustic resonator device comprising a resonator structure and a contact structure;

a patterned solder structure overlying the surface region and configured between the single crystal acoustic resonator device and the surface region;

a first air gap region provided from the patterned solder structure and configured between the resonator structure and a first portion of the mounting substrate member, wherein the first air gap region has a height of 10 um to 50 um;

a metallization structure configured overlying the single crystal acoustic resonator device, the metallization structure being coupled to the contact structure and having a first electrode and a second electrode;

a repassivation material overlying the metallization structure and the single crystal acoustic resonator device, the repassivation material having a first region exposing the first electrode and a second region exposing the second electrode;

a first under metal material overlying the repassivation material and covering the first region such that the first electrode is in contact with the first under metal material;

a second under metal material overlying the repassivation material and covering the second region such that the second electrode is in contact with the second under metal material;

a first copper pillar structure overlying the first under metal material;

a second copper pillar structure overlying the second under metal material;

a first solder bump overlying the first copper pillar structure; and a second solder bump configured overlying the second copper pillar structure.

2. The apparatus of claim 1 further comprising an epoxy material configured between the patterned solder structure and the surface region, the epoxy material being a two-stage epoxy material;

wherein the height is about 25 um;

wherein the height is measure from a first perimeter region to a second perimeter region of the first air gap region.

3. The apparatus of claim 1 further comprising a second air gap region provided from the patterned solder structure and configured between the contact structure and a second portion of the mounting substrate member.

4. The apparatus of claim 1 wherein the single crystal acoustic resonator device comprises a silicon substrate member, a silicon surface region, and a silicon backside region;

an epitaxial material comprising single crystal piezo material overlying the silicon surface region to a desired thickness;

a trench region to form an exposed portion of the silicon surface region through a pattern provided in the epitaxial material;

a topside landing pad metal within a vicinity of the trench region and overlying the exposed portion of the silicon surface region;

a first electrode member overlying a portion of the epitaxial material;

a second electrode member overlying the topside landing pad metal;

a backside trench region exposing a backside of the epitaxial material overlying the first electrode member, and exposing a backside of the landing pad metal; and a backside resonator metal material overlying the backside of the epitaxial material to form a connection from the epitaxial material to the to the backside of the landing pad metal to couple the second electrode member overlying the topside landing pad metal.

5. The apparatus of claim 4 wherein the mounting substrate member is characterized by a first coefficient of thermal expansion and wherein the silicon substrate member is characterized by a second coefficient of thermal expansion, the first coefficient of thermal expansion being matched to the second coefficient of thermal expansion; and wherein the mounting substrate member comprises a borosilicate glass material or a boro-float glass material.

6. A method of manufacturing a wafer scale package apparatus, the method comprising:

forming a mounting substrate member, the mounting substrate member being optically transparent, the mounting substrate member comprising a surface region;

forming a single crystal acoustic resonator device overlying a silicon substrate, the single crystal acoustic resonator device comprising a resonator structure and a contact structure;

forming a patterned solder structure overlying the single crystal acoustic resonator device;

forming a first air gap region provided from the patterned solder structure and configured between the resonator structure and a first portion of the mounting substrate member, wherein the first air gap region has a height of 10 um to 50 um;

forming an epoxy material overlying the patterned solder structure;

curing the epoxy material to mate the single crystal acoustic resonator device to the mounting substrate member;

thinning the silicon substrate;

forming a metallization structure overlying the single crystal acoustic resonator device, a first portion of the metallization structure being coupled to the contact structure;

forming a first solder bump overlying the metallization structure and coupled to the first portion of the metallization structure; and forming a second solder bump overlying the metallization structure and coupled to a second portion of the metallization structure.

7. The method of claim 6 wherein the epoxy material is a two-stage epoxy material;

wherein the height is about 25 um;

wherein the height is measure from a first perimeter region to a second perimeter region of the first air gap region.

8. The method of claim 6 further comprising forming a second air gap region provided from the patterned solder structure and configured between the contact structure and a second portion of the mounting substrate member.

9. The method of claim 6 wherein forming the single crystal acoustic resonator device comprises wherein the silicon substrate has a silicon surface region, and a silicon backside region;

forming an epitaxial material comprising single crystal piezo material overlying the silicon surface region to a desired thickness;

forming a trench region to form an exposed portion of the silicon surface region through a pattern provided in the epitaxial material;

forming a topside landing pad metal within a vicinity of the trench region and overlying the exposed portion of the silicon surface region;

forming a first electrode member overlying a portion of the epitaxial material;

forming a second electrode member overlying the topside landing pad metal;

forming a backside trench region exposing a backside of the epitaxial material overlying the first electrode member, and exposing a backside of the landing pad metal; and forming a backside resonator metal material overlying the backside of the epitaxial material to form a connection from the epitaxial material to the to the backside of the landing pad metal to couple the second electrode member overlying the topside landing pad metal.

10. The method of claim 9 wherein forming the mounting substrate member comprises forming a mounting substrate characterized by a first coefficient of thermal expansion and wherein the silicon substrate member is characterized by a second coefficient of thermal expansion, the first coefficient of thermal expansion being matched to the second coefficient of thermal expansion; and wherein forming the mounting substrate member comprises forming a borosilicate glass material or a borofloat glass material.

* * * * *